(12) United States Patent
Lee et al.

(10) Patent No.: US 12,141,085 B2
(45) Date of Patent: Nov. 12, 2024

(54) HYBRID TRANSMITTER WITH CALIBRATION

(71) Applicant: QUALCOMM Incorporated, San Diego, CA (US)

(72) Inventors: Changkyo Lee, San Diego, CA (US); Ashwin Sethuram, San Clemente, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 189 days.

(21) Appl. No.: 18/081,631

(22) Filed: Dec. 14, 2022

(65) Prior Publication Data
US 2024/0202151 A1 Jun. 20, 2024

(51) Int. Cl.
*G06F 13/38* (2006.01)
*H03K 17/687* (2006.01)

(52) U.S. Cl.
CPC ......... *G06F 13/38* (2013.01); *H03K 17/6871* (2013.01); *G06F 2213/40* (2013.01)

(58) Field of Classification Search
CPC . G06F 13/38; G06F 2213/40; H03K 17/6871; H03K 19/0005; H03K 19/00384; H03K 19/017545; H03K 19/018557
USPC ................... 710/33; 326/83, 86, 87, 90, 91; 327/108, 109
See application file for complete search history.

(56) References Cited

U.S. PATENT DOCUMENTS

| 7,245,172 | B2 | 7/2007 | Boerstler et al. | |
|---|---|---|---|---|
| 10,063,232 | B1 * | 8/2018 | Tan | H03K 19/0185 |
| 10,103,731 | B2 | 10/2018 | Hardee | |
| 11,038,508 | B2 | 6/2021 | De Haas et al. | |
| 11,210,241 | B1 * | 12/2021 | Gupta | G11C 29/022 |
| 2011/0316726 | A1 * | 12/2011 | Hollis | H04L 25/4927 341/56 |
| 2021/0083677 | A1 | 3/2021 | Kathuria et al. | |

FOREIGN PATENT DOCUMENTS

| KR | 101075523 B1 | 10/2011 |
|---|---|---|
| WO | 2022026059 A1 | 2/2022 |

OTHER PUBLICATIONS

Partial International Search Report—PCT/US2023/079240—ISA/EPO—Feb. 27, 2024.
International Search Report and Written Opinion—PCT/US2023/079240—ISA/EPO—May 14, 2024.

* cited by examiner

*Primary Examiner* — Ilwoo Park
(74) *Attorney, Agent, or Firm* — Loza & Loza, LLP

(57) ABSTRACT

A transmitter includes a pull-down circuit coupled between an output of the transmitter and a first rail, a first pull-up circuit coupled between a second rail and the output of the transmitter, and a second pull-up circuit coupled between the second rail and the output of the transmitter. The transmitter also includes a control circuit coupled to a control input of the first pull-up circuit and a control input of the second pull-up circuit. The control circuit is configured to output a first control signal to the control input of the first pull-up circuit, wherein the first control signal controls a drive strength of the first pull-up circuit. The control circuit is also configured to output a second control signal to the control input of the second pull-up circuit, wherein the second control signal controls a drive strength of the second pull-up circuit.

26 Claims, 12 Drawing Sheets

HYBRID TRANSMITTER WITH CALIBRATION

BACKGROUND

Field

Aspects of the present disclosure relate generally to transmitters, and, more particularly, to hybrid transmitters.

Background

A first chip may communicate with a second chip via one or more transmission lines between the chips. For example, each of the chips may include one or more transmitters for transmitting signals to the other one of the chips via one or more of the transmission lines, and each of the chips may include one or more receivers for receiving signals from the other one of the chips via one or more of the transmission lines.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system including a transmitter. The transmitter includes a pull-down circuit coupled between an output of the transmitter and a first rail, wherein the pull-down circuit has a signal input coupled to a first input of the transmitter. The transmitter also includes a first pull-up circuit coupled between a second rail and the output of the transmitter, wherein the first pull-up circuit has a signal input coupled to a second input of the transmitter. The transmitter further includes a second pull-up circuit coupled between the second rail and the output of the transmitter, wherein the second pull-up circuit has a signal input coupled to the first input of the transmitter. The transmitter further includes a control circuit coupled to a control input of the first pull-up circuit and a control input of the second pull-up circuit. The control circuit is configured to output a first control signal to the control input of the first pull-up circuit, wherein the first control signal controls a drive strength of the first pull-up circuit, and output a second control signal to the control input of the second pull-up circuit, wherein the second control signal controls a drive strength of the second pull-up circuit.

A second aspect relates to a method of calibration using a calibration circuit. The calibration circuit includes a first pull-up circuit and a second pull-up circuit, wherein each one of the first pull-up circuit and the second pull-up circuit is configured to pull up an output node. The method includes setting a signal input of the first pull-up circuit to one of multiple voltage levels, sweeping a first control signal, wherein the first control signal controls a drive strength of the first pull-up circuit, and comparing a voltage at the output node with a target voltage using a comparator. The method also includes, if an output of the comparator toggles, then determining a value of the first control signal at which the output of the comparator toggles. The method also includes, if the first control signal reaches a threshold value without the output of the comparator toggling, then calibrating a second control signal, wherein the second control signal controls a drive strength of the second pull-up circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
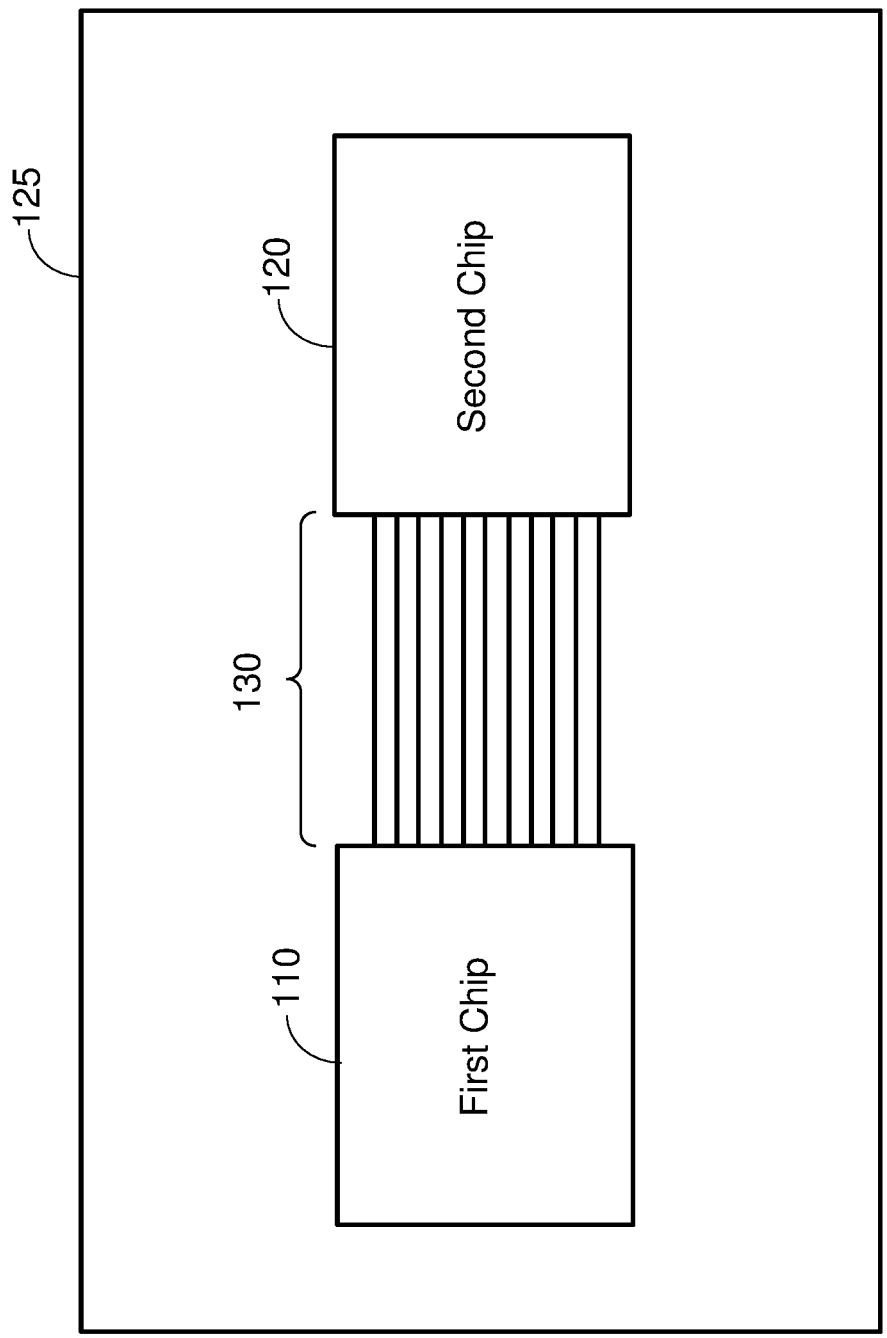
FIG. 1 shows an example of multiple chips according to certain aspects of the present disclosure.

FIG. 1 shows an example of a first chip 110 and a second chip 120 according to certain aspects. The first chip 110 and the second chip 120 may be mounted on a substrate 125 (e.g., a printed circuit board, a ceramic substrate, etc.). However, it is to be appreciated that the first chip 110 and the second chip 120 need not be mounted on a substrate in some implementations.

FIG. 1 also shows multiple transmission lines 130 (also referred to as channels or links) coupled between the first chip 110 and the second chip 120 to facilitate chip-to-chip (i.e., die-to-die) communication between the chips 110 and 120. In this example, each of the chips 110 and 120 may include one or more transmitters (also referred to as drivers)

for transmitting signals to the other one of the chips 110 and 120 via one or more of the transmission lines 130, and each of the chips 110 and 120 may include one or more receivers for receiving signals from the other one of the chips 110 and 120 via one or more of the transmission lines 130.

In one example, the first chip 110 may include one or more processors and a memory controller, and the second chip 120 may include a memory circuit (e.g., a double data rate (DDR) memory, a low-power DDR (LPDDR) memory, etc.). In this example, the memory controller on the first chip 110 may be configured to provide the one or more processors on the first chip 110 with access to the memory circuit on the second chip 120. However, it is to be appreciated that the present disclosure is not limited to memory.

Figure 2:
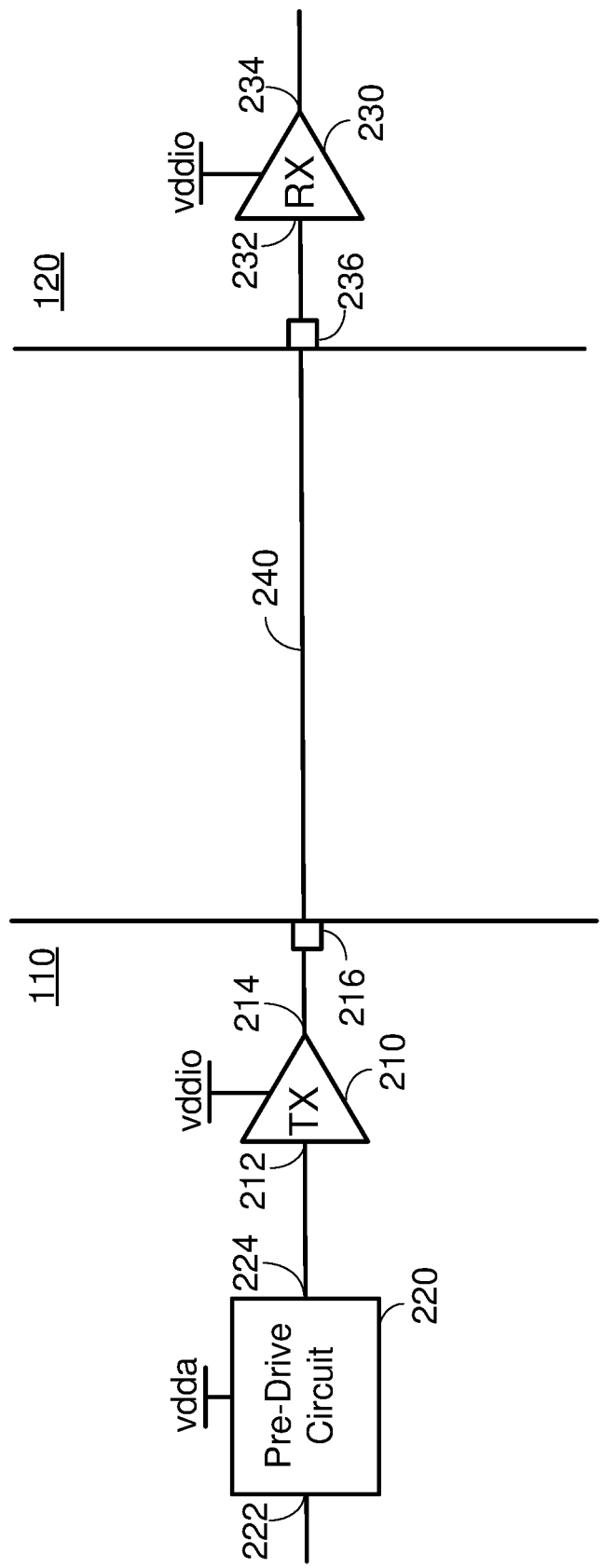
FIG. 2 shows an example of a pre-drive circuit, a transmitter, a receiver, and a transmission line between the transmitter and the receiver according to certain aspects of the present disclosure.

FIG. 2 shows an example of chip-to-chip communication via a transmission line 240 from among the multiple transmission lines 130 shown in FIG. 1. In this example, the first chip 110 includes a transmitter 210 (also referred to as a driver), a pre-drive circuit 220 coupled to an input 212 of the transmitter 210, and a first pad 216 coupled to an output 214 of the transmitter 210. The second chip 120 includes a receiver 230, and a second pad 236 coupled to an input 232 of the receiver 230. One end of the transmission line 240 is coupled to the first pad 216, and the other end of the transmission line 240 is coupled to the second pad 236.

In operation, the pre-drive circuit 220 may be configured to receive bits (e.g., from a processor), generate a pre-drive signal based on the received bits, and output the pre-drive signal to the input 212 of the transmitter 210. The transmitter 210 may be configured to receive the pre-drive signal from the pre-drive circuit 220, generate an output signal based on the pre-drive signal, and transmit the output signal to the receiver 230 on the second chip 120 via the transmission line 240. The receiver 230 may be configured to receive the output signal of the transmitter 210 at the input 232 of the receiver 230, process the received signal, and output the processed signal to one or more circuits (not shown) on the second chip 120 for further processing. The processing performed by the receiver 230 may include amplification, sampling, equalization, or any combination thereof.

In the example in FIG. 2, the pre-drive circuit 220 is powered by a first supply voltage vdda in a first power domain (also referred to as a voltage domain), and the transmitter 210 is powered by a second supply voltage vddio in a second power domain. Other circuits (e.g., logic) on the first chip 110 may also be powered by the first supply voltage vdda in the first power domain. In this example, the pre-drive signal from the pre-drive circuit 220 may have a voltage swing of approximately vdda. In certain aspects, the first supply voltage vdda is scalable, as discussed further below.

In the example shown in FIG. 2, the receiver 230 on the second chip 120 is also powered by the second supply voltage vddio. Thus, in this example, the transmitter 210 and the receiver 230 are powered in the same power domain (i.e., the second power domain). In one example, the voltage level of the second supply voltage vddio may be set by the second chip 120 or a standard (e.g., Joint Electron Device Engineering Council (JEDEC) standard). Thus, in this example, the first chip 110 may not be able to unilaterally scale the second supply voltage vddio since the voltage level of the second supply voltage vddio is set by the second chip 120 or the standard. However, it is to be appreciated that the present disclosure is not limited to this example.

Figure 3:
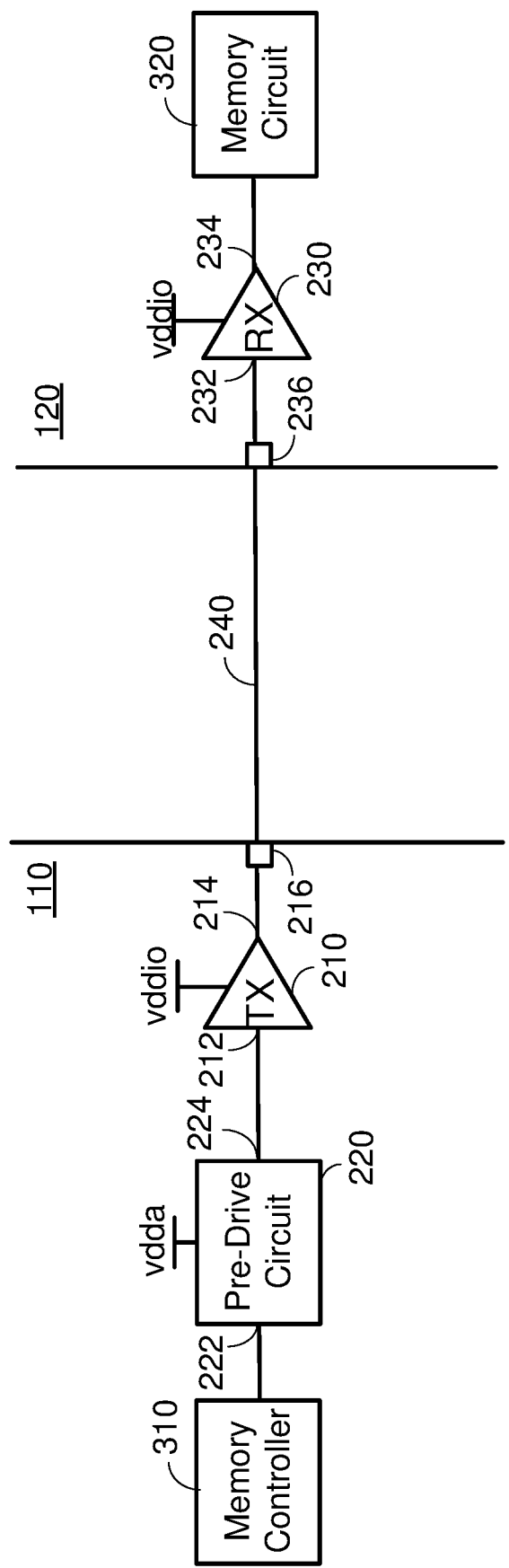
FIG. 3 shows an example of a first chip including a memory controller and a second chip including a memory circuit according to certain aspects.

FIG. 3 shows an example in which the first chip 110 includes a memory controller 310 (e.g., DDR memory controller). In this example, the memory controller 310 is coupled to the input 222 of the pre-drive circuit 220, and may be configured to output bits to the pre-drive circuit 220 for transmission to a memory circuit 320 (e.g., DDR memory) on the second chip. The bits may include data bits, address bits, and/or command bits to be sent to the memory circuit 320. In this example, the pre-drive circuit 220 and the transmitter 210 may be included in a physical layer (PHY) and/or an input/output (I/O) interface interfacing the memory controller 310 on the first chip 110 with the memory circuit 320 the second chip 120. The output 234 of the receiver 230 is coupled to the memory circuit 320 to provide the memory circuit 320 with the bits (e.g., data bits, address bits, and/or command bits) received from the first chip 110. In this example, the receiver 230 may be part of a PHY and/or an I/O interface interfacing the memory circuit 320 (e.g., DDR memory) on the second chip 120 with the memory controller 310 on the first chip 110. It is to be appreciated that the present disclosure is not limited to the example of memory shown in FIG. 3, and may be used in other applications using chip-to-chip communication.

Figure 4:
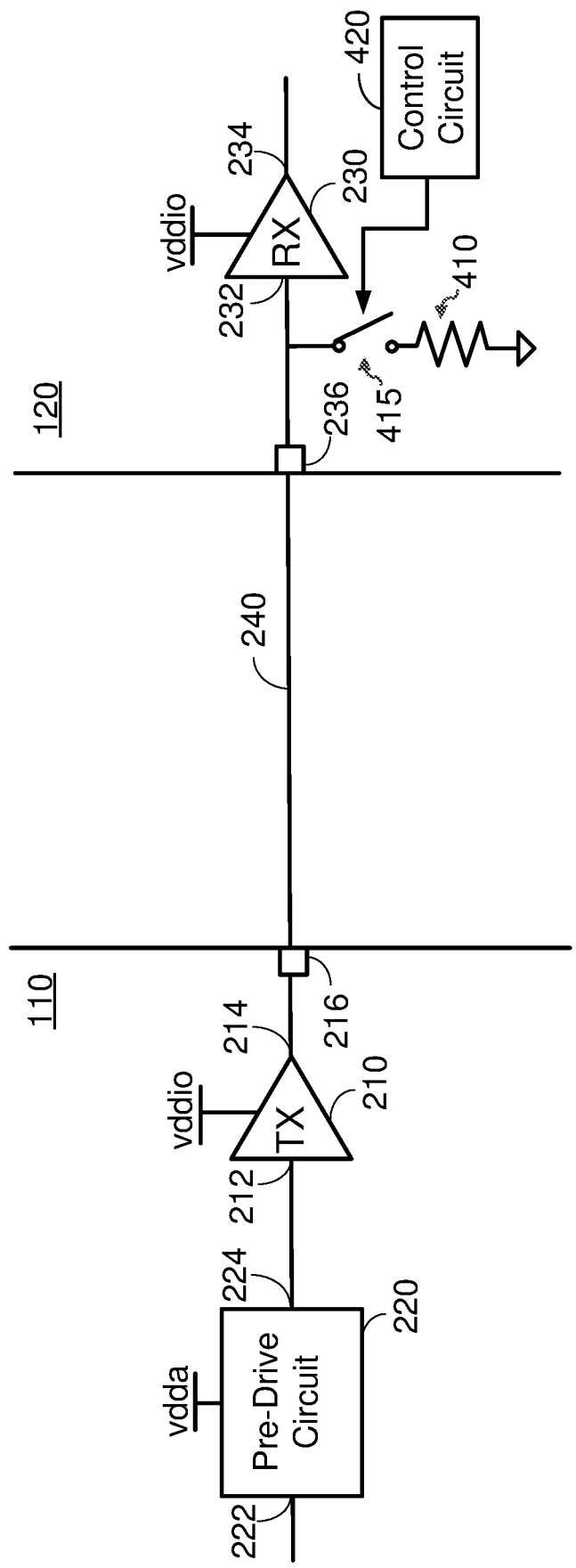
FIG. 4 shows an example of a termination resistor according to certain aspects of the present disclosure.

In certain aspects, the second chip 120 may support operation in a terminated mode or unterminated mode. In this regard, FIG. 4 shows an example in which the second chip 120 includes a termination resistor 410 and a switch 415. The termination resistor 410 and the switch 415 are coupled in series between the second pad 236 and ground (shown in the example in FIG. 4) or coupled in series between the second pad 236 and another potential. The termination resistor 410 may be configured to match the termination line impedance with the output impedance of the transmitter 210 to reduce signal reflections.

In the example in FIG. 4, the second chip 120 may also include a control circuit 420 configured to control the on/off state of the switch 415 to selectively operate the transmitter 210 and the receiver 230 in the terminated mode or the unterminated mode. To operate in the terminated mode, the control circuit 420 turns on the switch 415 to couple the termination resistor 410 to the second pad 236. To operate in the unterminated mode, the control circuit 420 turns off the switch 415 to decouple the termination resistor 410 from the second pad 236 (and hence decouple the termination resistor 410 from the transmission line 240).

In certain aspects, the transmitter 210 and the receiver 230 may support operation at different frequencies (e.g., for different data rates). In these aspects, the control circuit 420 may operate the transmitter 210 and the receiver 230 in the terminated mode or the unterminated mode based on the current frequency of the transmitter 210. For example, the control circuit 420 may turn on the terminated mode at high frequencies (e.g., one or more gigahertz) to reduce signal reflections for improved signal quality. In this case, the termination resistor 410 provides higher performance for high frequencies at the expense of power dissipation across the termination resistor 410. The control circuit 420 may turn on the unterminated mode at low frequencies. In this case, the signal quality requirement at the receiver 230 may be lower at low frequencies allowing the receiver 230 to tolerate signal reflections at low frequencies (e.g., below a gigahertz). The unterminated mode reduces power consumption by decoupling the termination resistor 410 from the transmission line 240, which avoids the power dissipation across the termination resistor 410.

As discussed above, the transmitter 210 and the receiver 230 may support operation at different frequencies (e.g., for different data rates). For example, for applications that do not require high data rates, the transmitter 210 and the receiver 230 may operate at a lower frequency to conserve power, and, for applications requiring high data rates, the transmitter 210 and the receiver 230 may operate at a higher frequency. To improve power efficiency, it is desirable to scale the first supply voltage vdda with frequency. For example, the first supply voltage vdda may be scaled down (i.e., reduced) for a lower frequency to reduce power consumption by the pre-drive circuit 220 and other circuits (not shown) powered by vdda.

In a current approach, the first supply voltage vdda is fixed in the terminated mode. In this approach, the first supply voltage vdda is calibrated for the maximum frequency in the terminated mode, and then fixed for lower frequencies in the terminated mode. A problem with this approach is that the first supply voltage vdda may be higher than needed to meet one or more specifications at the lower frequencies in the terminated mode, thereby reducing power efficiency.

To address this, aspects of the present disclosure provide a hybrid transmitter that facilitates voltage scaling across frequencies in the terminated mode for improved power efficiency. Aspects of the present disclosure also provide a calibration scheme for calibrating the hybrid transmitter at different voltage levels for the first supply voltage vdda to facilitate voltage scaling across frequencies. The above aspects and other aspects of the present disclosure are discussed further below.

Figure 5:
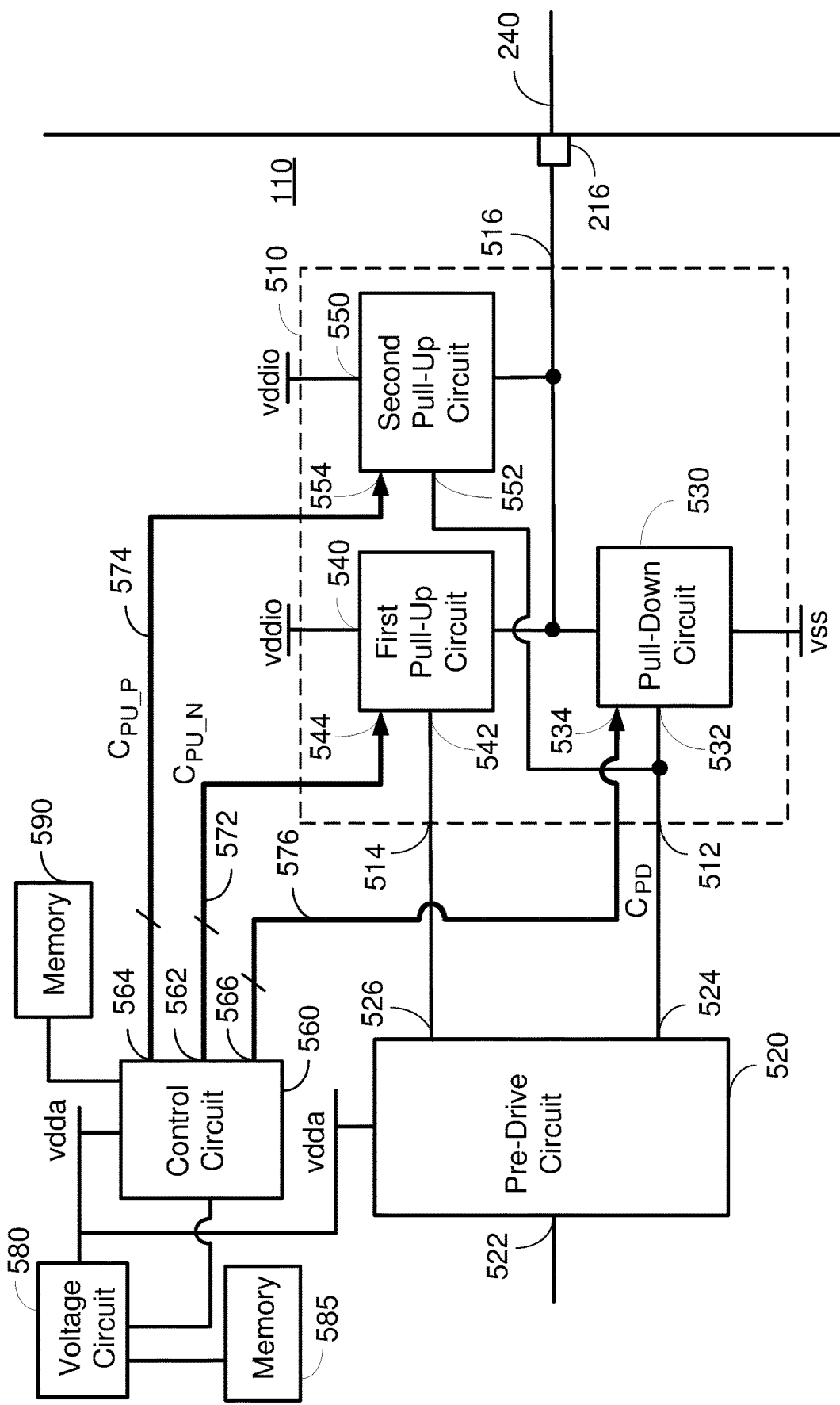
FIG. 5 shows an example of a transmitter including a first pull-up circuit and a second pull-up circuit according to certain aspects of the present disclosure.

FIG. 5 shows an exemplary transmitter 510 according to aspects of the present disclosure. As discussed further below, the transmitter 510 facilitates voltage scaling across frequencies in the terminated mode or both the terminated mode and the unterminated mode for improved power efficiency. An exemplary calibration scheme for calibrating the transmitter 510 at different voltages levels for the first supply voltage vdda is also provided according to certain aspects.

In the example shown in FIG. 5, the first chip 110 includes the transmitter 510 for chip-to-chip communication with the second chip 120 (shown in FIGS. 2 to 4). However, it is to be appreciated that the present disclosure is not limited to this example. In this example, the first chip 110 also includes a pre-drive circuit 520, a control circuit 560, and a voltage circuit 580 according to certain aspects.

The pre-drive circuit 520 has an input 522, a first output 524, and a second output 526. In this example, the transmitter 510 has a first input 512 coupled to the first output 524 of the pre-drive circuit 520, a second input 514 coupled to the second output 526 of the pre-drive circuit 520, and an output 516 coupled to the first pad 216. However, it is to be appreciated that the present disclosure is not limited to this example. The first pad 216 may be coupled to the input 232 of the receiver 230 (shown in FIGS. 2 to 4) on the second chip 120 via the transmission line 240. As discussed above, the second circuit 120 may include the termination resistor 410 for enabling the terminated mode.

In this example, the pre-drive circuit 520 is powered by the first supply voltage vdda in the first power domain, and the transmitter 510 is powered by the second supply voltage vddio in the second power domain. The first supply voltage vdda may also power the control circuit 560 and/or other circuits (not shown) on the first chip 110. As discussed above, the second supply voltage vddio may be set by the second chip 120 or a standard (e.g., JEDEC standard).

In this example, the voltage circuit 580 is configured to provide the first supply voltage vdda to the pre-drive circuit 520 and the control circuit 560. The voltage circuit 580 may also provide the first supply voltage vdda to other circuits (not shown) on the first chip 110. In certain aspects, the voltage circuit 580 is configured to receive a voltage control signal (e.g., from the control circuit 560 and/or another circuit), and set the voltage level of the first supply voltage vdda based on the voltage control signal. Thus, the voltage circuit 580 allows the voltage level of the first supply voltage vdda to be scaled, as discussed further below. Although FIG. 5 shows the voltage circuit 580 on the first chip 110, it is to be appreciated that this need not be the case. For example, the voltage circuit 580 may be integrated on another chip (not shown) that is coupled to the first chip 110 in some implementations.

In operation, the pre-drive circuit 520 is configured to receive bits (e.g., from the memory controller 310 in FIG. 3) to be sent to the second chip 120 at the input 522, and generate a pre-drive signal based on the received bits. The pre-drive circuit 520 may output the pre-drive signal at the first output 524 and output a complement (i.e., inverse) of the pre-drive signal at the second output 526. The pre-drive signal and the complement of the pre-drive signal may each have a voltage swing of approximately vdda, which is scalable as discussed above. In this example, the transmitter 510 is configured to receive the pre-drive signal at the first input 512, and receive the complement of the pre-drive signal at the second input 514. The transmitter 510 may generate an output signal based on the pre-drive signal and the complement of the pre-drive signal, and output the output signal at the output 516, which is coupled to the receiver 230 via the transmission line 240. The receiver 230 (shown in FIGS. 2 to 4) may be configured to receive the output signal of the transmitter 510, process the received signal, and output the processed signal to one or more circuits (e.g., the memory circuit 320 in FIG. 3) on the second chip 120 for further processing, as discussed above.

In this example, the transmitter 510 includes a pull-down circuit 530, a first pull-up circuit 540, and a second pull-up circuit 550. The pull-down circuit 530 may also be referred to as a pull-down driver and each of the pull-up circuits 540 and 550 may also be referred to as a pull-up driver.

The first pull-up circuit 540 has a signal input 542 coupled to the second output 526 of the pre-drive circuit 520 to receive the complement of the pre-drive signal. In the example in FIG. 5, the first pull-up circuit 540 is coupled between the supply rail for the second supply voltage vddio and the output 516 of the transmitter 510. In certain aspects, the first pull-up circuit 540 is configured to pull up the output 516 of the transmitter 510 (e.g., to drive the transmission line 240 high) based on the complement of the pre-drive signal. For example, the first pull-up circuit 540 may be configured to pull up the output 516 when the complement of the pre-drive signal is high (i.e., when the pre-drive signal is low). In certain aspects, the first pull-up circuit 540 includes pull-up devices implemented with NFETs.

In the example in FIG. 5, the first pull-up circuit 540 has a control input 544 coupled to a first output 562 of the control circuit 560 via control path 572. In this example, the first pull-up circuit 540 is configured to receive a first control signal $C_{PU\_N}$ from the control circuit 560 at the control input 544, and set a drive strength of the first pull-up circuit 540 based on the first control signal $C_{PU\_N}$. In one example, the first control signal $C_{PU\_N}$ may be in the form of a digital code including multiple bits. However, it is to be appreciated that the first control signal $C_{PU\_N}$ is not limited to this example.

The second pull-up circuit 550 has a signal input 552 coupled to the first output 524 of the pre-drive circuit 520 to receive the pre-drive signal. In the example in FIG. 5, the second pull-up circuit 550 is coupled between the supply rail for the second supply voltage vddio and the output 516 of the transmitter 510. In certain aspects, the second pull-up circuit 550 is configured to pull up the output 516 of the transmitter 510 (e.g., to drive the transmission line 240 high) based on the pre-drive signal. For example, the second pull-up circuit 550 may be configured to pull up the output 516 when the pre-drive signal is low (i.e., when the complement of the pre-drive signal is high). In certain aspects, the second pull-up circuit 550 includes pull-up devices implemented with PFETs.

In the example in FIG. 5, the second pull-up circuit 550 has a control input 554 coupled to a second output 564 of the control circuit 560 via control path 574. In this example, the second pull-up circuit 550 is configured to receive a second control signal $C_{PU\_P}$ from the control circuit 560 at the control input 554, and set a drive strength of the second pull-up circuit 550 based on the second control signal $C_{PU\_P}$. In one example, the second control signal $C_{PU\_P}$ may be in the form of a digital code including multiple bits. However, it is to be appreciated that the second control signal $C_{PU\_P}$ is not limited to this example.

In the above example, the first pull-up circuit 540 includes pull-up devices implemented with NFETs and the second pull-up circuit 550 includes pull-up devices implemented with PFETs. In this regard, the transmitter 510 may be referred to as a hybrid transmitter including both NFETs and PFETs for pull up. In this example, the control circuit 560 programs the drive strength of the first pull-up circuit 540 using the first control signal $C_{PU\_N}$ and programs the drive strength of the second pull-up circuit 550 using the second control signal $C_{PU\_P}$. Because the control circuit 560 programs the drive strength of the first pull-up circuit 540 and the drive strength second pull-up circuit 550 using separate control signals (i.e., the first control signal $C_{PU\_N}$ and the second control signal $C_{PU\_P}$), the control circuit 560 can independently adjusts the drive strength of the first pull-up circuit 540 and the drive strength second pull-up circuit 550. It is to be appreciated that the drive strength of the first pull-up circuit 540 and the drive strength second pull-up circuit 550 also depend on the voltage level of vdda, as discussed further below.

The pull-down circuit 530 has a signal input 532 coupled to the first output 524 of the pre-drive circuit 520 to receive the pre-drive signal. In the example in FIG. 5, the pull-down circuit 530 is coupled between the output 516 of the transmitter 510 and a low rail which has a voltage vss (e.g., ground) that is lower than vddio. In other words, the low rail is at a lower potential than the supply rail for vddio. In certain aspects, the pull-down circuit 520 is configured to pull down the output 516 of the transmitter 510 (e.g., to drive the transmission line 240 low) based on the pre-drive signal. For example, the pull-down circuit 530 may be configured to pull down the output 516 when the pre-drive signal is high. In certain aspects, the pull-down circuit 530 includes pull-down devices implemented with NFETs.

In the example in FIG. 5, the pull-down circuit 530 has a control input 534 coupled to a third output 566 of the control circuit 560 via control path 576. In this example, the pull-down circuit 530 is configured to receive a third control signal $C_{PD}$ from the control circuit 560 at the control input 534, and set a drive strength of the pull-down circuit 530 based on the third control signal $C_{PD}$. In one example, the third control signal $C_{PD}$ may be in the form of a digital code including multiple bits. However, it is to be appreciated that the third control signal $C_{PD}$ is not limited to this example.

As discussed above, the transmitter 510 facilitates voltage scaling across frequencies in the terminated mode or both the terminated mode and the unterminated mode. In certain aspects, the pre-drive circuit 520 may be configured to output the pre-drive signal and the complement of the pre-drive signal to the transmitter 510 at any one of multiple frequencies supported by the pre-drive circuit 520 and the transmitter 510. For example, the multiple frequencies supported by the pre-drive circuit 520 and the transmitter 510 may be within a range between a few hundred megahertz and several gigahertz. In certain aspects, the current frequency of the pre-drive circuit 520 and the transmitter 510 may be selected from among the multiple frequencies based on, for example, a performance mode of a processor (not shown) on the first chip 110 sending data to the second chip 120 via the transmitter 510. For example, a higher frequency may be selected for a higher performance mode, and a lower frequency may be selected for a lower performance mode.

In certain aspects, the voltage circuit 580 is configured to set the voltage level of the first supply voltage vdda based on the current frequency of the pre-drive circuit 520 and transmitter 510. For example, the voltage circuit 580 may receive a signal indicating the current frequency from the control circuit 560 or another circuit, and set the voltage level of vdda based on the indicated frequency. In one example, a memory 585 coupled to the voltage circuit 580 stores a lookup table that maps each of the frequencies supported by the pre-drive circuit 520 and the transmitter 510 to a voltage level for the first supply voltage vdda. The memory 585 may be integrated on the first chip 110 or on another chip (not shown) coupled to the first chip 110. In this example, the voltage circuit 580 may look up the current frequency in the lookup table and set the voltage level of vdda to the corresponding voltage level in the lookup table (i.e., the voltage level in the lookup table hat maps to the current frequency).

For example, the lookup table may map a first frequency to a first voltage level for vdda and map a second frequency to a second voltage level for vdda where the first frequency is higher than the second frequency and the first voltage level is higher than the second voltage level. In this example, the voltage circuit 580 sets the voltage level of vdda to the first voltage level for the first frequency and sets the voltage level of vdda to the second voltage level for the second frequency. Thus, in this example, the voltage circuit 580 reduces (i.e., scales down) the voltage level of the first supply voltage vdda for the second frequency, which is lower than the first frequency. The first frequency and the second frequency may be in the terminated mode. Thus, in this example, the voltage circuit 580 provides voltage scaling for at least the first frequency and the second frequency in the terminated mode for improved power efficiency.

In certain aspects, the frequencies supported by the pre-drive circuit 520 and the transmitter 510 may be partitioned into frequency bands (also referred to as frequency bins) in which each of the frequency band includes respective one or more of the frequencies. In this example, the lookup table may map each of the frequency bands to a respective voltage level for the first supply voltage vdda. In certain aspects, the lookup table maps lower frequency bands to lower voltage levels for vdda and maps higher frequency bands to higher voltage levels for vdda. In this example, the voltage circuit 580 determines in which one of the frequency bands the current frequency resides, and sets the voltage level of vdda to the corresponding voltage level in the lookup table (i.e., the voltage level that maps to the frequency band in which the current frequency resides).

In certain aspects, the control circuit 560 is configured to set the drive strengths of the first pull-up circuit 540 and the second pull-up circuit 550 based on the voltage level of the first supply voltage vdda, which, in turn, may be set based on the current frequency of the pre-drive circuit 520 and transmitter 510. As discussed further below, this allows the first supply voltage vdda to be scaled with frequency while still meeting one or more specifications (e.g., an output high voltage $V_{OH}$ specification). In one example, the control circuit 560 may receive a signal indicating the voltage level of vdda from the voltage circuit 580 or another circuit, and set the drive strengths of the first pull-up circuit 540 and the second pull-up circuit 550 using the first and second control signals $C_{PU\_N}$ and $C_{PU\_P}$, respectively, based on the indicated voltage level.

In one example, a memory 590 coupled to the control circuit 560 stores a lookup table that maps each voltage level of the vdda to a value for the first control signal $C_{PU\_N}$ and a value for the second control signal $C_{PU\_P}$. The memory 590 may be the same as the memory 585, or a different memory. For the example where each of the control signals $C_{PU\_N}$ and $C_{PU\_P}$ includes a respective digital code, the value of each of the first and second control signals $C_{PU\_N}$ and $C_{PU\_P}$ is determined by the bits of the respective digital code. In some implementations, the digital code of each of the control signals $C_{PU\_N}$ and $C_{PU\_P}$ may be a binary digital code having $2^n$ possible values where n is the number of bits in the binary digital code. This is because there are $2^n$ possible combinations of bit values for the bits in the binary digital node, and each one of the possible values of the binary digital code corresponds to a respective one of the combinations of bit values. In other implementations, the digital code of each of the control signals $C_{PU\_N}$ and $C_{PU\_P}$ may be a thermometer code having n possible values where n is the number of bits in the digital code. In yet another example, the digital code of the first control signal $C_{PU\_N}$ may be a binary digital code and the digital code for the second control signal $C_{PU\_P}$ may be a thermometer digital code, or vice versa. However, it is to be appreciated that the present disclosure is not limited to these examples.

In this example, the control circuit 560 may look up the current voltage level of vdda in the lookup table, and set the values of the first and second control signals $C_{PU\_N}$ and $C_{PU\_P}$ to the corresponding values for the first and second control signals $C_{PU\_N}$ and $C_{PU\_P}$ in the lookup table (i.e., the values for the first and second control signals $C_{PU\_N}$ and $C_{PU\_P}$ in the lookup table that map to the current voltage level of vdda). For example, the lookup table may map a first voltage level of vdda to a first value for the first control signal $C_{PU\_N}$ and a second value for the second control signal $C_{PU\_P}$, and map a second voltage level of vdda to a third value for the control signal $C_{PU\_N}$ and a fourth value for the second control signal $C_{PU\_P}$. In this example, the control circuit 560 sets the value of the first control signal $C_{PU\_N}$ to the first value and sets the value of the second control signal $C_{PU\_P}$ to the second value if the voltage level of vdda is the first voltage level. The control circuit 560 sets the value of the first control signal $C_{PU\_N}$ to the third value and sets the value of the second control signal $C_{PU\_P}$ to the fourth value if the voltage level of vdda is the second voltage level. The first value and the second value may be different, and the third value and the fourth value may be different. Also, the first value and the third value may be different, and the second value and the fourth value may be different.

Aspects of the present disclosure provide a calibration scheme for determining a value for the first control signal $C_{PU\_N}$ and a value for the second control signal $C_{PU\_P}$ for each voltage level of vdda in the lookup table. As discussed further below, at each voltage level of vdda in the lookup table, the calibration scheme determines a value for the first control signal $C_{PU\_N}$ and a value for the second control signal $C_{PU\_P}$ that meet one or more specifications (e.g., an output high voltage $V_{OH}$ specification) at the voltage level. This facilitates voltage scaling for improved power efficiency while meeting the one or more specifications across voltage levels for vdda, which scales with frequency. The calibration scheme according to aspects of the present disclosure is described further below.

In certain aspects, the control circuit 560 is configured set the drive strength of the pull-down circuit 530 based on the voltage level of the first supply voltage vdda. In this example, the control circuit 560 may receive the signal indicating the voltage level of vdda, and set the drive strength of the first pull-down circuit 530 using the third control signal $C_{PD}$ based on the indicated voltage level.

In one example, the lookup table stored in the memory 595 maps each voltage level of the vdda to a value for the third control signal $C_{PD}$. For the example where the third control signal $C_{PD}$ includes a digital code, the value of the third control signal $C_{PD}$ is determined by the bits of the digital code. The digital code may be a binary digital code having $2^n$ possible values or a binary thermometer code having n possible values where n is the number of bits in the digital code. However, it is to be appreciated that the present disclosure is not limited to these examples. In this example, the control circuit 560 may look up the current voltage level of vdda in the lookup table, and set the value of the third control signal $C_{PD}$ to the corresponding value for the third control signal the $C_{PD}$ in the lookup table (i.e., the value for the third control signal $C_{PD}$ in the lookup table that maps to the current voltage level of vdda). The value for the third control signal $C_{PD}$ for each voltage level of vdda in the lookup table may be determined by the calibration scheme discussed above according to certain aspects.

Figure 6:
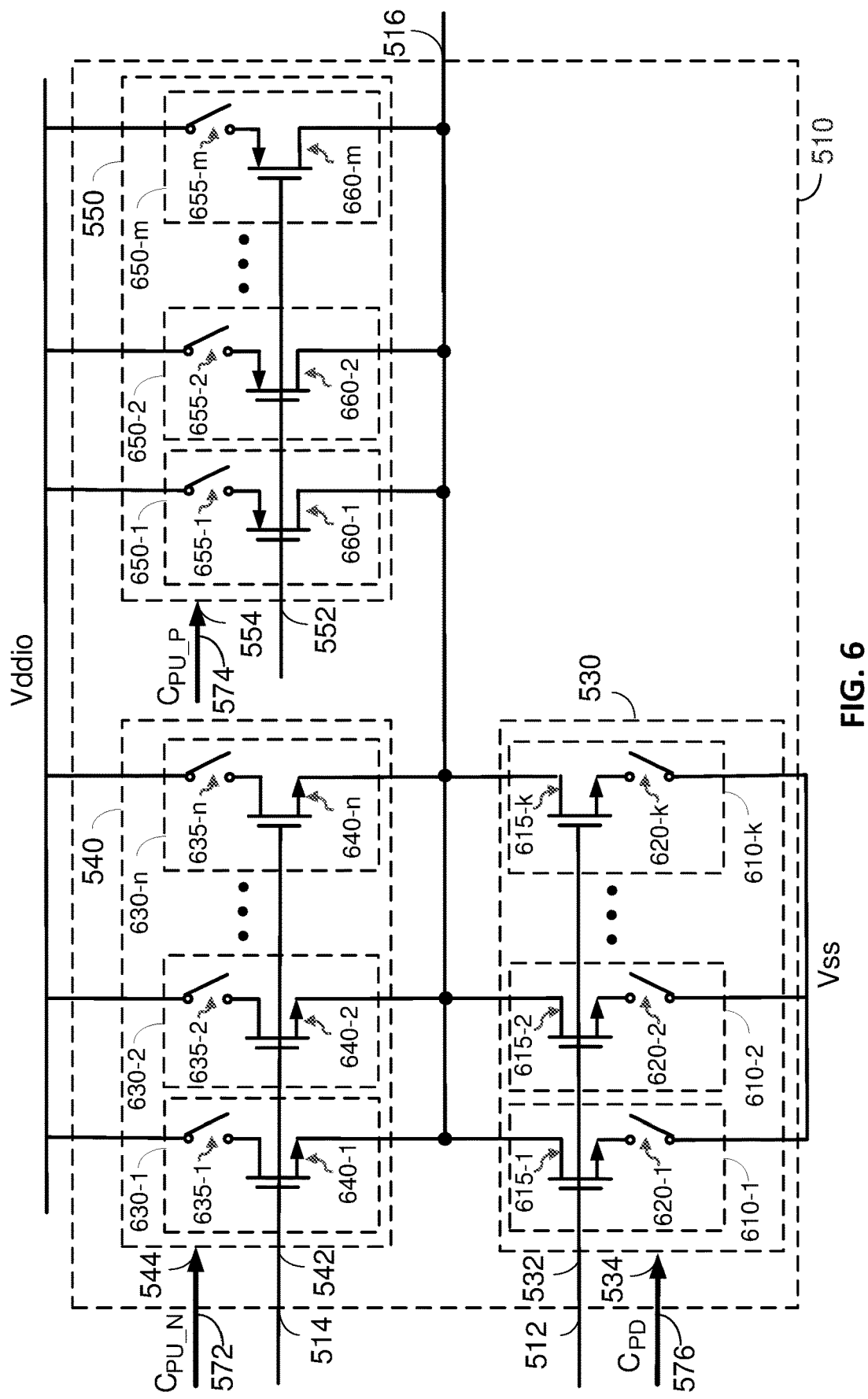
FIG. 6 shows an exemplary implementation of the first pull-up circuit and the second pull-up circuit according to certain aspects of the present disclosure.

FIG. 6 shows an exemplary implementation of the pull-down circuit 530, the first pull-up circuit 540, and the second pull-up circuit 550 according to certain aspects.

In the example shown in FIG. 6, the first pull-up circuit 540 includes multiple segments 630-1 to 630-n coupled in parallel between the supply rail for vddio and the output 516 of the transmitter 510. Each of the segments 630-1 to 630-n may also be referred to as a leg or another term. Each of the segments 630-1 to 630-n includes a respective NFET 640-1 to 640-n and a respective switch 635-1 to 635-n coupled in series between the supply rail and the output 516 of the transmitter 510. The gate of each of the NFETs 640-1 to 640-n is coupled to the signal input 542 of the first pull-up circuit 540 to receive the complement of the pre-drive signal. The on/off states of the switches 635-1 to 635-n are controlled by the first control signal $C_{PU\_N}$, as discussed further below.

In certain aspects, the NFETs 640-1 to 640-n are binary weighted. For example, the widths (e.g., channel or gate widths) of the NFETs 640-1 to 640-n may be binary weighted, in which the widths of the NFETs 640-1 to 640-n differ from one another by powers of two. In other implementations, the widths of the NFETs 640-1 to 640-n may be the same.

The switches 635-1 to 635-n are configured to select which ones of the NFETs 640-1 to 640-n are enabled or disabled based on the first control signal $C_{PU\_N}$. In this example, each of the NFETs 640-1 to 640-n is enabled or disabled depending on the on/off state of the respective one of the switches 635-1 to 635-n (i.e., the switch in the respective segment 630-1 to 630-n). More particularly, each of the NFETs 640-1 to 640-n is enabled when the respective one of the switches 635-1 to 635-n is turned on (i.e., closed)

and each of the NFETs 640-1 to 640-n is disabled when the respective one of the switches 635-1 to 635-n is turn off (i.e., opened). In this example, the first control signal $C_{PU\_N}$ sets the drive strength of the first pull-up circuit 540 by controlling which ones of the NFETs 640-1 to 640-n are enabled or disabled using the switches 635-1 to 635-n.

For the example where the first control signal $C_{PU\_N}$ is a digital code including multiple bits, each of the bits may correspond to a respective one of the NFETs 640-1 to 640-n. In this example, each bit may enable the respective one of the NFETs 640-1 to 640-n by turning on the respective one of the switches 635-1 to 635-n when the bit has a first logic value, and each bit may disable the respective one of the NFETs 640-1 to 640-n by turning off the respective one of the switches 635-1 to 635-n when the bit has a second logic value. The first logic value may be one and the second logic value may be zero, or vice versa. For the example in which the NFETs 640-1 to 640-n are binary weighted, the digital code implementing the first control signal $C_{PU\_N}$ may be a binary digital code having $2^n$ possible values, where each value corresponds to a different combination of bit values for the binary digital code. For the example in which the NFETs 640-1 to 640-n have the same width, the digital code implementing the first control signal $C_{PU\_N}$ may be a thermometer digital code having n possible values, where each value corresponds to different number of bits in the thermometer digital code having the first logic value. However, it is to be appreciated that the present disclosure is not limited to these examples.

In the example shown in FIG. 6, the second pull-up circuit 550 includes multiple segments 650-1 to 650-m coupled in parallel between the supply rail for vddio and the output 516 of the transmitter 510. Each of the segments 650-1 to 650-m may also be referred to as a leg or another term. Each of the segments 650-1 to 650-m includes a respective PFET 660-1 to 660-m and a respective switch 655-1 to 655-m coupled in series between the supply rail and the output 516 of the transmitter 510. The gate of each of the PFETs 660-1 to 660-m is coupled to the signal input 552 of the second pull-up circuit 550 to receive the pre-drive signal. The on/off states of the switches 655-1 to 655-m are controlled by the second control signal $C_{PU\_P}$, as discussed further below. The number of segments 650-1 to 650-m in the second pull-up circuit 550 and the number of segments 630-1 to 630-m in the first pull-up circuit 540 may be the same (i.e., n=m) or different.

In some implementations the widths of the PFETs 660-1 to 660-m may be the same. In other implementations, the widths of the PFETs 660-1 to 660-m are binary weighted, in which the widths of the PFETs 660-1 to 660-m differ from one another by powers of two.

The switches 655-1 to 655-m are configured to select which ones of the PFETs 660-1 to 660-m are enabled or disabled based on the second control signal $C_{PU\_P}$. In this example, each of the PFETs 660-1 to 660-m is enabled or disabled depending on the on/off state of the respective one of the switches 655-1 to 655-m (i.e., the switch in the respective segment 650-1 to 650-m). More particularly, each of the PFETs 660-1 to 660-m is enabled when the respective one of the switches 655-1 to 655-m is turned on (i.e., closed) and each of the PFETs 660-1 to 660-m is disabled when the respective one of the switches 655-1 to 655-m is turn off (i.e., opened). In this example, the first second signal $C_{PU\_P}$ sets the drive strength of the second pull-up circuit 550 by controlling which ones of the PFETs 660-1 to 660-m are enabled or disabled using the switches 655-1 to 655-m.

For the example where the second control signal $C_{PU\_P}$ is a digital code including multiple bits, each of the bits may correspond to a respective one of the PFETs 660-1 to 660-m. In this example, each bit may enable the respective one of the PFET 660-1 to 660-m by turning on the respective one of the switches 655-1 to 655-m when the bit has the second logic value (e.g., zero), and each bit may disable the respective one of the PFETs 660-1 to 660-m by turning off the respective one of the switches 655-1 to 655-m when the bit has the first logic value (e.g., one). For the example in which the PFETs 660-1 to 660-m have the same width, the digital code implementing the second control signal $C_{PU\_P}$ may be a thermometer digital code having m possible values, where each value corresponds to different number of bits in the thermometer digital code having the second logic value. For the example in which the PFETs 660-1 to 660-m are binary weighted, the digital code implementing the second control signal $C_{PU\_P}$ may be a binary digital code having $2^m$ possible values, where each value corresponds to a different combination of bit values for the binary digital code. However, it is to be appreciated that the present disclosure is not limited to these examples.

In certain aspects, the NFETs 640-1 to 640-n in the first pull-up circuit 540 may be binary weighted, and the PFETs 660-1 to 660-m in the second pull-up circuit 550 may have the same width. However, it is to be appreciated that the present disclosure is not limited to this example.

In the example shown in FIG. 6, the first pull-up circuit 540 includes the NFETs 640-1 to 640-n for pulling up the output 516 of the transmitter 510 and the second pull-up circuit 550 includes the PFETs 660-1 to 660-m for pulling up the output 516 of the transmitter 510. In this example, the second pull-up circuit 550 may be used to help pull up the output 516 of the transmitter 510 for cases where the first supply voltage vdda is relatively low. This is because the drive strengths of the NFETs 640-1 to 640-n decrease as vdda decreases. If vdda is low, then the NFETs 640-1 to 640-n may not be able to pull up the output 516 of the transmitter 510 high enough to meet one or more specifications (e.g., output high voltage $V_{OH}$ specification) even when the first control signal $C_{PU\_N}$ is saturated (e.g., at the highest value). In this case, the second pull-up circuit 550 may be used to assist in pulling up the output 516 of the transmitter 510 to meet the one or more specifications. Thus, the second pull-up circuit 550 helps the voltage circuit 580 to scale down the voltage level of vdda while still allowing the transmitter 510 to meet the one or more specifications.

In the example shown in FIG. 6, the pull-down circuit 530 includes multiple segments 610-1 to 610-k coupled in parallel between the output 516 of the transmitter 510 and the low rail (e.g., ground). Each of the segments 610-1 to 610-k may also be referred to as a leg or another term. Each of the segments 610-1 to 610-k includes a respective NFET 615-1 to 615-k and a respective switch 620-1 to 620-k coupled in series between the output 516 of the transmitter 510 and the low rail. The gate of each of the NFETs 615-1 to 615-k is coupled to the signal input 532 of the pull-down circuit 530 to receive the pre-drive signal. The on/off states of the switches 620-1 to 620-k are controlled by the third control signal $C_{PD}$, as discussed further below. The number of segments 610-1 to 610-k in the pull-down circuit 530 and the number of segments 630-1 to 630-n in the first pull-up circuit 540 may be the same (i.e., n=k) or different.

In certain aspects, the NFETs 615-1 to 615-k are binary weighted. For example, the widths (e.g., channel or gate widths) of the NFETs 615-1 to 615-k may be binary weighted, in which the widths of the NFETs 615-1 to 615-k differ from one another by powers of two. In other implementations, the widths of the NFETs 615-1 to 615-k may be the same.

The switches 620-1 to 620-k are configured to select which ones of the NFETs 615-1 to 615-k are enabled or disabled based on the third control signal $C_{PD}$. In this example, each of the NFETs 615-1 to 615-k is enabled or disabled depending on the on/off state of the respective one of the switches 620-1 to 620-k (i.e., the switch in the respective segment 610-1 to 610-k). More particularly, each of the NFETs 615-1 to 615-k is enabled when the respective one of the switches 620-1 to 620-k is turned on (i.e., closed) and each of the NFETs 615-1 to 615-k is disabled when the respective one of the switches 620-1 to 620-k is turn off (i.e., opened). In this example, the third control signal $C_{PD}$ sets the drive strength of the pull-down circuit 530 by controlling which ones of the NFETs 615-1 to 615-k are enabled or disabled using the switches 620-1 to 620-k.

For the example where the third control signal $C_{PD}$ is a digital code including multiple bits, each of the bits may correspond to a respective one of the NFETs 615-1 to 615-k. In this example, each bit may enable the respective one of the NFETs 615-1 to 615-k by turning on the respective one of the switches 620-1 to 620-k when the bit has the first logic value (e.g., one), and each bit may disable the respective one of the NFETs 615-1 to 615-k by turning off the respective one of the switches 620-1 to 620-k when the bit has the second logic value (e.g., zero). For the example in which the NFETs 615-1 to 615-k are binary weighted, the digital code implementing the third control signal $C_{PD}$ may be a binary digital code having $2^k$ possible values, where each value corresponds to a different combination of bit values for the binary digital code. For the example in which the NFETs 615-1 to 615-k have the same width, the digital code implementing the third control signal $C_{PD}$ may be a thermometer digital code having k possible values, where each value corresponds to different number of bits in the thermometer digital code having the first logic value. However, it is to be appreciated that the present disclosure is not limited to these examples.

Figure 7:
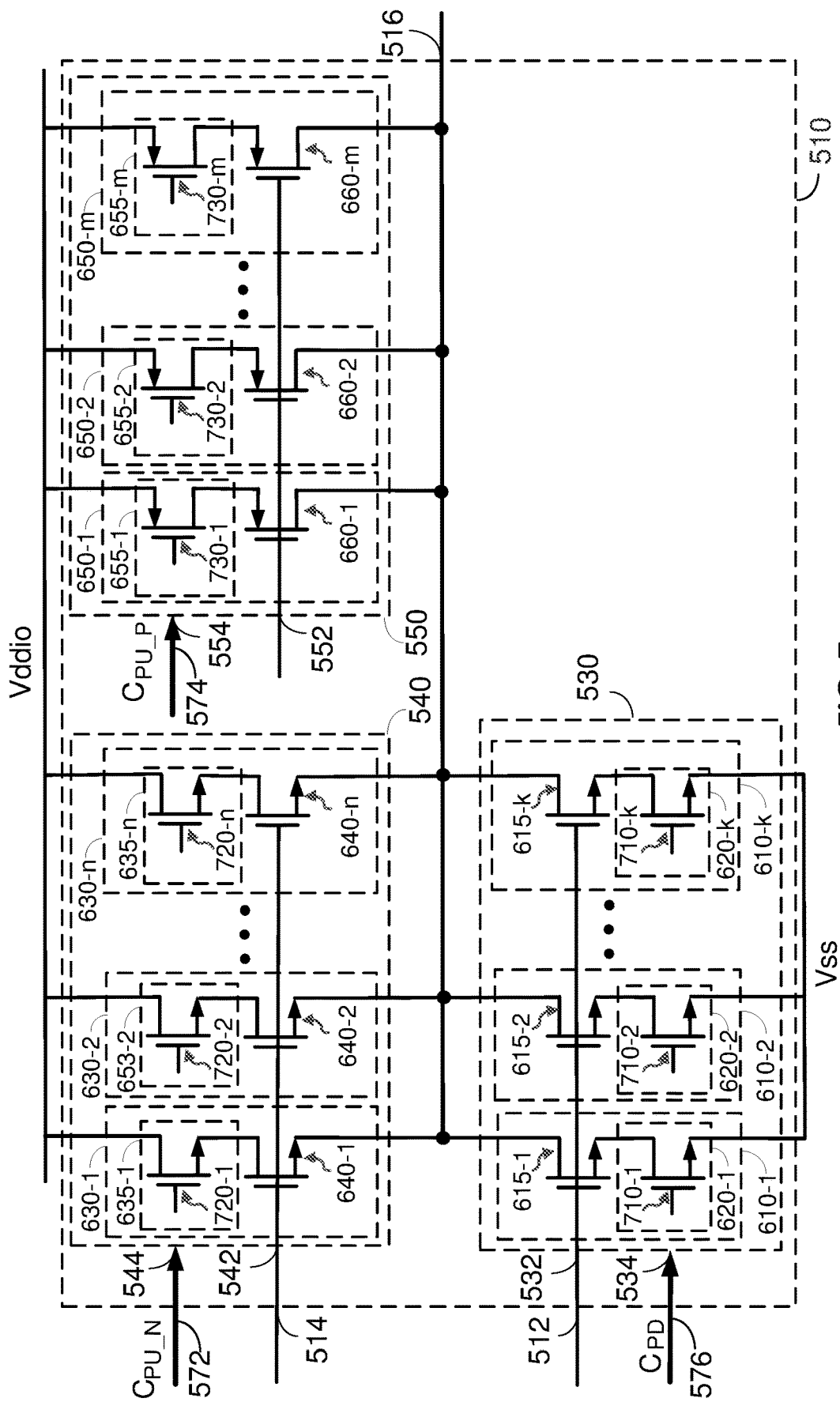
FIG. 7 shows an exemplary implementation of switches in the first pull-up circuit and the second pull-up circuit according to certain aspects of the present disclosure.

Each of the switches 620-1 to 620-k, 635-1 to 635-n, and 655-1 to 655-m may be implemented with a transistor, a transmission gate, or another type of switch. FIG. 7 shows an example in which each of the switches 635-1 to 635-n in the first pull-up circuit 540 includes a respective one of transistors 720-1 to 720-n, and each of the switches 655-1 to 655-m in the second pull-up circuit 550 includes a respective one of transistors 730-1 to 730-m. In this example, each of the transistors 720-1 to 720-n is implemented with an NFET and each of the transistors 730-1 to 730-m is implemented with a PFET. However, it is to be appreciated that the present disclosure is not limited to this example.

In this example, the first control signal $C_{PU\_N}$ may be a digital code including multiple bits. For example, the control path 572 may include n parallel lines, in which each line carries a respective one of the bits of the digital code. In this example, each of the lines may be coupled to the gate of a respective one of the transistors 720-1 to 720-n. Thus, in this example, each of the lines inputs the respective bit to the gate of the respective one of the transistors 720-1 to 720-n. For ease of illustration, the individual lines of the control path 572 and the individual connections to the gates of the transistors 720-1 to 720-n are not explicitly shown in FIG. 7.

In the example shown in FIG. 7, each of the transistors 720-1 to 720-n is implemented with an NFET. Thus, in this example, each of the transistors 720-1 to 720-n turns on when the respective bit is high, and turns off when the respective bit is low. Each bit may have a voltage level of approximately vdda when the bit is high, and a voltage level of approximately vss (e.g., ground) when the bit is low.

The second control signal $C_{PU\_P}$ may be a digital code including multiple bits. For example, the control path 574 may include m parallel lines, in which each line carries a respective one of the bits of the digital code. In this example, each of the lines may be coupled to the gate of a respective one of the transistors 730-1 to 730-m. Thus, in this example, each of the lines inputs the respective bit to the gate of the respective one of the transistors 730-1 to 730-m. For ease of illustration, the individual lines of the control path 574 and the individual connections to the gates of the transistors 730-1 to 730-n are not explicitly shown in FIG. 7

In the example shown in FIG. 7, each of the transistors 730-1 to 730-n is implemented with a PFET. Thus, in this example, each of the transistors 720-1 to 720-n turns on when the respective bit is low, and turns off when the respective bit is high. Each bit may have a voltage level of approximately vdda when the bit is high, and a voltage level of approximately vss (e.g., ground) when the bit is low.

FIG. 7 also shows an example in which each of the switches 620-1 to 620-k in the pull-down circuit 530 includes a respective one of transistors 710-1 to 710-k. In this example, each of the transistors 710-1 to 710-k is implemented with an NFET. However, it is to be appreciated that the present disclosure is not limited to this example.

In this example, the third control signal $C_{PD}$ may be a digital code including multiple bits. For example, the control path 576 may include k parallel lines, in which each line carries a respective one of the bits of the digital code. In this example, each of the lines may be coupled to the gate of a respective one of the transistors 710-1 to 710-k. Thus, in this example, each of the lines inputs the respective bit to the gate of the respective one of the transistors 710-1 to 710-n. For ease of illustration, the individual lines of the control path 576 and the individual connections to the gates of the transistors 710-1 to 710-n are not explicitly shown in FIG. 7.

In the example shown in FIG. 7, each of the transistors 720-1 to 720-n is implemented with an NFET. Thus, in this example, each of the transistors 710-1 to 710-k turns on when the respective bit is high, and turns off when the respective bit is low. Each bit may have a voltage level of approximately vdda when the bit is high, and a voltage level of approximately vss (e.g., ground) when the bit is low.

Figure 8:
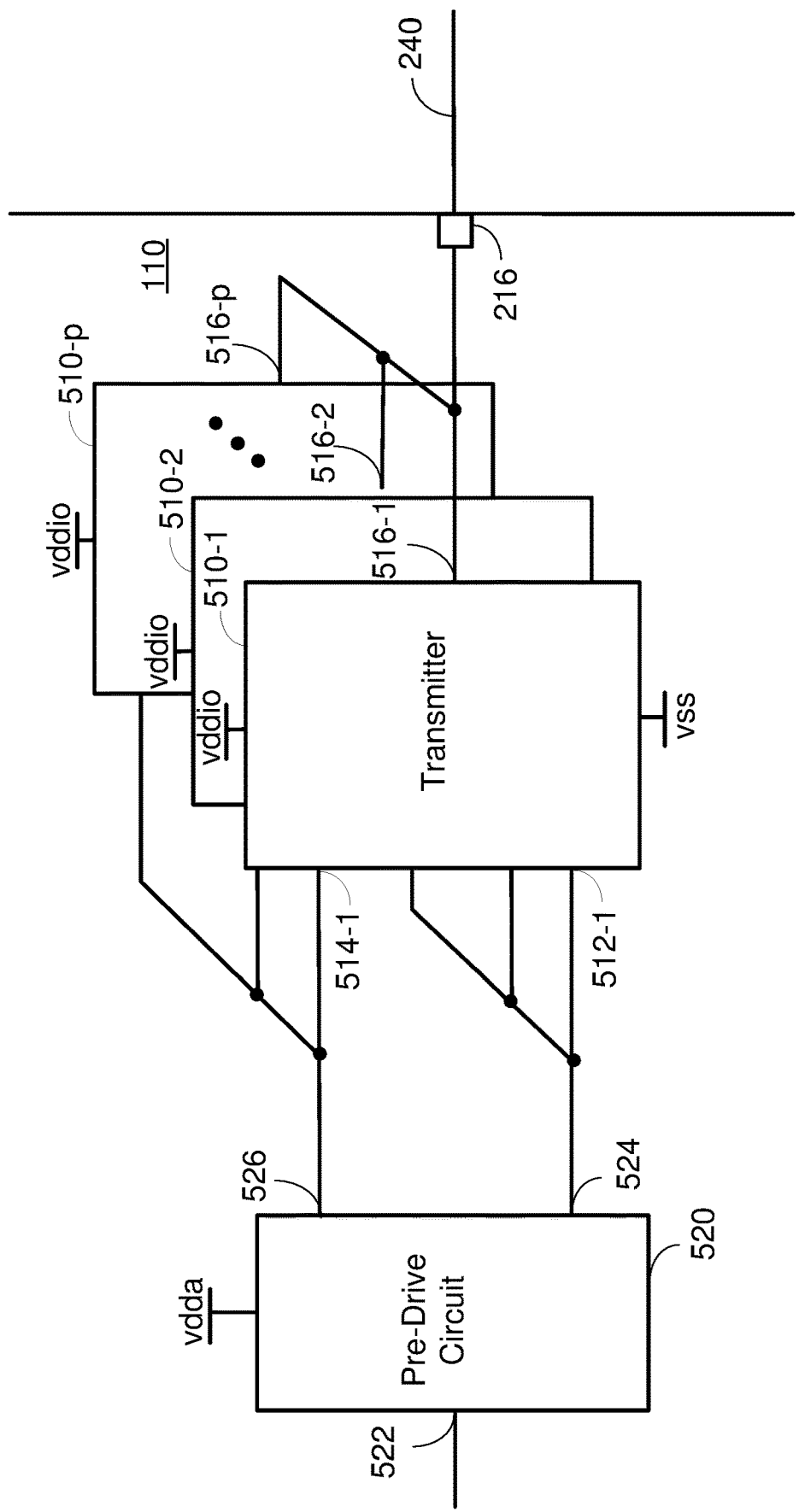
FIG. 8 shows an example of multiple transmitters coupled in parallel according to certain aspects of the present disclosure.

In certain aspects, multiple instances of the transmitter 510 may be coupled in parallel to drive the transmission line 240. In this regard, FIG. 8 shows an example of multiple transmitters 510-1 to 510-p where each of the transmitters 510-1 to 510-p is a separate instance (i.e., copy) of the transmitter 510. Thus, the description of the transmitter 510 given above with reference to FIGS. 5 to 7 may be applied to each of the transmitters 510-1 to 510-p. In FIG. 8, a numerical identifier is appended to the reference numbers for each of the transmitters 510-1 to 510-p to distinguish the transmitters 510-1 to 510-p.

In this example, the first inputs 512-1 to 512-p of the transmitters 510-1 to 510-p are coupled to the first output 525 of the pre-drive circuit 520 to receive the pre-drive signal, and the second inputs 514-1 to 514-p are coupled to the second output 526 of the pre-drive circuit 520 to receive the complement of the pre-drive signal. The outputs 516-1 to 516-p of the transmitters 510-1 to 510-p are coupled to the first pad 216 to drive the transmission 240. In this example, the control circuit 560 (not shown in FIG. 8) may output the control signals $C_{PU\_N}$, $C_{PU\_P}$ and $C_{PD}$ discussed above to each of the transmitters 510-1 to 510-*p*. In other words, the control circuit 560 may use the same set of control signals $C_{PU\_N}$, $C_{PU\_P}$ and $C_{PD}$ to program the drive strengths of each of the transmitters 510-1 to 510-*p*.

Figure 9:
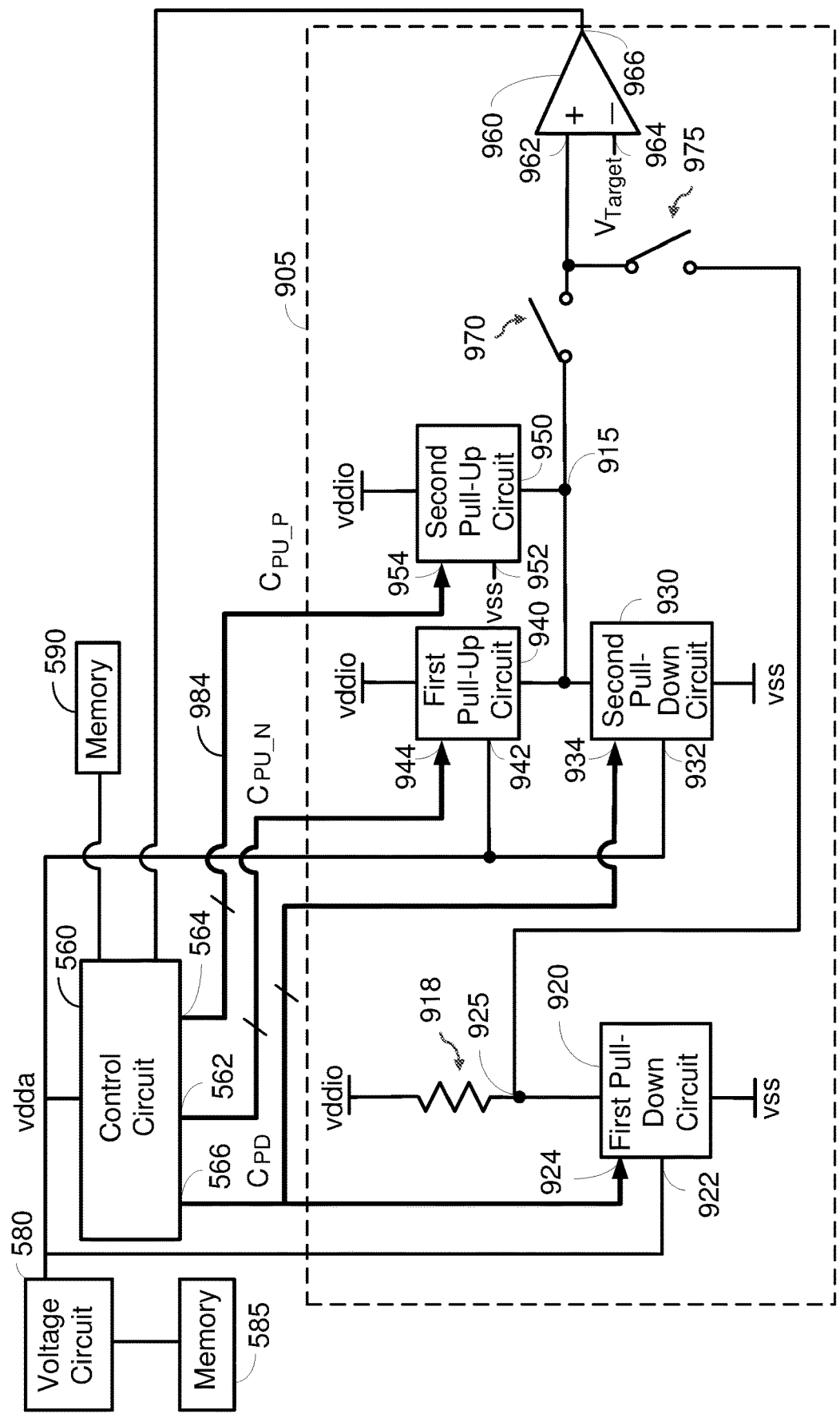
FIG. 9 shows an example of a calibration circuit according to certain aspects of the present disclosure.

FIG. 9 shows an example of a calibration circuit 905 according to certain aspects of the present disclosure. The calibration circuit 905 includes a resistor 918, a first pull-down circuit 920, a second pull-down circuit 930, a first pull-up circuit 940, a second pull-up circuit 950, and a comparator 960 according to certain aspects. The calibration circuit 905 may be integrated on the first chip 110 in some implementations. In other implementations, the resistor 918 may be off chip with the rest of the calibration circuit 905 integrated on the first chip 110.

In the example in FIG. 9, the resistor 918 is coupled between the supply rail for vddio and a node 925, and the first pull-down circuit 920 is coupled between the node 925 and the low rail (e.g., ground). The first pull-down circuit 920 has a signal input 922 and a control input 924. In certain aspects, the first pull-down circuit 920 may be replica (i.e., a separate instance) of the pull-down circuit 530 discussed above, in which the signal input 922 corresponds to the signal input 532 in FIG. 5, and the control input 924 corresponds to the control input 534 in FIG. 5. The first pull-down circuit 920 may be implemented with any one of the exemplary implementations of the pull-down circuit 530 shown in FIGS. 6 and 7. In the example in FIG. 9, the signal input 922 of the first pull-down circuit 920 is driven high (e.g., vdda). For example, the signal input 922 may be coupled to the voltage circuit 580, in which the voltage circuit 580 outputs vdda to the signal input 222 of the first pull-down circuit 920 to drive the signal input 922 high. The control input 924 is coupled to the third output 566 of the control circuit 560, and configured to receive the third control signal $C_{PD}$ from the control circuit 560.

The comparator 960 has a first input 962, a second input 964, and an output 966 coupled to the control circuit 560. In this example, the calibration circuit 905 includes a switch 975 coupled between the node 925 and the first input 962 of the comparator 960 for selectively coupling the node 925 to the first input 962 of the comparator 960. However, it is to be appreciated that the present disclosure is not limited to this example. The second input 964 of the comparator 960 is configured to receive a target voltage (labeled "$V_{Target}$" in FIG. 9). As discussed further below, the target voltage may be equal to vddio/2, but is not limited to this example. It is to be appreciated that the same comparator 960 may be used to calibrate the pull-up circuit 920 and calibrate the pull-up circuits 940 and 950 as shown in the example in FIG. 9, or separate comparators may be used to calibrate the pull-up circuit 920 and calibrate the pull-up circuits 940 and 950 in other implementations.

In certain aspects, the resistor 918 is used to calibrate the third control signal $C_{PD}$ so that the impedance of the pull-down circuit 920 is approximately equal the resistance of the resistor 918. In one example, the resistance of the resistor 918 is approximately equal to a desired output impedance for the transmitter 510 that provides impedance matching with the transmission line 240 and/or the receiver 230. For the example where multiple instances of the transmitters 510-1 to 510-*p* are coupled in parallel, the resistance of the resistor 918 may be approximately equal to p times the desired output impedance of the transistors 510-1 to 510-*p* coupled in parallel, where the desired output impedance provides impedance matching with the transmission line 240 and/or the receiver 230. This is because the individual output impedance of each of the transistors 510-1 to 510-*p* may be approximately equal to p times the output impedance of the transistors 510-1 to 510-*p* coupled in parallel. However, it is to be appreciated that the present disclosure is not limited to this example. In general, the resistance of the resistor 918 may be chosen based on a desired output impedance for a single transmitter 510 or multiple transmitters 510-1 to 510-*p* coupled in parallel.

In certain aspects, during calibration of the third control signal $C_{PD}$, the control circuit 560 turns on the switch 975 to couple the node 925 to the first input 962 of the comparator 960. Also, the target voltage input to the second input 964 of the comparator 960 is set to a voltage level of approximately vddio/2.

The third control signal $C_{PD}$ may be calibrated for a first one of the voltage levels of vdda in the lookup table as follows. The voltage circuit 580 may set the voltage of vdda to the first one of the voltage levels. The control circuit 560 may then sequentially change the value of the third control signal $C_{PD}$ while observing the output 966 of the comparator 960. In this example, the output 966 of the comparator 960 toggles (e.g., the logic state at the output 966 toggles) when the third control signal $C_{PD}$ causes the impedance of the first pull-down circuit 920 to be approximately equal to the resistance of the resistor 918. This is because the voltage at the node 925 is approximately equal to vddio/2 when the impedance of the first pull-down circuit 920 is approximately equal to the resistance of the resistor 918. When the output 962 of the comparator 960 toggles, the control circuit 560 may record the value of the third control signal $C_{PD}$ at which the output 962 toggles, and use this value as the calibrated value of the third control signal $C_{PD}$ for the first one of the voltage levels of vdda. For example, the control circuit 560 may store this value in the lookup table in the memory 590 as the value of the third control signal $C_{PD}$ that maps to the first one of the voltage level of vdda. Thus, in this example, the control circuit 560 determines a value of the third control signal $C_{PD}$ that causes the impedance of the first pull-down circuit 920 to be approximately equal to the resistance of the resistor 918.

The control circuit 560 may perform the exemplary calibration procedure discussed above for each one of the other voltage levels of vdda in the lookup table. For example, the control circuit 560 may perform the above calibration procedure for each of the voltage levels of vdda in the lookup table to populate the values of the third control signal $C_{PD}$ in the lookup table for the different voltage levels of vdda. The control circuit 560 may then use the values of the third control signal $C_{PD}$ in the lookup table to set the value of the third control signal $C_{PD}$ for the pull-down circuit 530 in the transmitter 510 based on the current voltage level of vdda, as discussed above.

In the example in FIG. 9, the second pull-down circuit 930, the first pull-up circuit 940, and the second pull-up circuit 950 may form a replica of the transmitter 510 for performing calibration. In this regard, the second pull-down circuit 930 may be a separate instance of the pull-down circuit 530, the first pull-up circuit 940 may be a separate instance of the first pull-up circuit 540, and the second pull-up circuit 950 may be a separate instance of the second pull-up circuit 550.

The second pull-down circuit 930 is coupled between an output node 915 and the low rail. The second pull-down circuit 930 has a signal input 932 and a control input 934. As discussed above, the second pull-down circuit 930 may be replica (i.e., a separate instance) of the pull-down circuit 530, in which the signal input 932 corresponds to the signal input 532 in FIG. 5, and the control input 934 corresponds to the control input 534 in FIG. 5. The second pull-down circuit 930 may be implemented with any one of the exemplary implementations of the pull-down circuit 530 shown in FIGS. 6 and 7. In the example in FIG. 9, the signal input 932 of the first pull-down circuit 920 is driven high (e.g., vdda). For example, the signal input 932 may be coupled to the voltage circuit 580, in which the voltage circuit 580 outputs vdda to the signal input 932 of the second pull-down circuit 930 to drive the signal input 932 high. The control input 934 is coupled to the third output 566 of the control circuit 560, and configured to receive the third control signal $C_{PD}$ from the control circuit 560.

The first pull-up circuit 940 is coupled between the supply rail for vddio and the output node 915. The first pull-up circuit 940 has a signal input 942 and a control input 944. As discussed above, the first pull-up circuit 940 may be replica (i.e., a separate instance) of the first pull-up circuit 540, in which the signal input 942 corresponds to the signal input 542 in FIG. 5, and the control input 944 corresponds to the control input 544 in FIG. 5. The first pull-up circuit 940 may be implemented with any one of the exemplary implementations of the first pull-up circuit 540 shown in FIGS. 6 and 7 (e.g., the first pull-up circuit 940 includes instances of the switches 635-1 to 635-$n$ and the NFETs 640-1 to 640-$n$ for pull up). In the example in FIG. 9, the signal input 942 of the first pull-up circuit 940 is driven high (e.g., vdda). For example, the signal input 942 may be coupled to the voltage circuit 580, in which the voltage circuit 580 outputs vdda to the signal input 942 of the first pull-up circuit 940 to drive the signal input 942 high. The control input 944 is coupled to the first output 562 of the control circuit 560, and configured to receive the first control signal $C_{PU\_N}$ from the control circuit 560.

The second pull-up circuit 950 is coupled between the supply rail for vddio and the output node 915. The second pull-up circuit 950 has a signal input 952 and a control input 954. As discussed above, the second pull-up circuit 950 may be replica (i.e., a separate instance) of the second pull-up circuit 550, in which the signal input 952 corresponds to the signal input 552 in FIG. 5, and the control input 954 corresponds to the control input 554 in FIG. 5. The second pull-up circuit 950 may be implemented with any one of the exemplary implementations of the second pull-up circuit 550 shown in FIGS. 6 and 7 (e.g., the second pull-up circuit 950 includes instances of the switches 655-1 to 655-$m$ and the PFETs 660-1 to 660-$m$ for pull up). In the example in FIG. 9, the signal input 952 of the second pull-down circuit 940 is driven low (e.g., vss). The control input 954 is coupled to the second output 564 of the control circuit 560, and configured to receive the second control signal $C_{PU\_P}$ from the control circuit 560.

In this example, the calibration circuit 905 includes a switch 970 coupled between the output node 915 and the first input 962 of the comparator 960 for selectively coupling the output node 915 to the first input 962 of the comparator 960. However, it is to be appreciated that the present disclosure is not limited to this example. The second input 964 of the comparator 960 is configured to receive the target voltage.

In certain aspects, during calibration of the first control signal $C_{PU\_N}$ and the second control signal $C_{PU\_P}$, the control circuit 560 turns on the switch 970 to couple the node 925 to the first input 962 of the comparator 960. In addition, the target voltage may be set to an output high voltage $V_{HO}$ defined in a specification (e.g., JEDEC specification) so that the transmitter 510 meets the output high voltage $V_{HO}$ defined in the specification. In certain aspects, the output high voltage $V_{HO}$ may be equal to vddio/2. However, it is to be appreciated that the output high voltage $V_{HO}$ may have a different voltage. The output high voltage $V_{HO}$ may be a voltage at the output 516 of the transmitter 510 that is high enough for the receiver 230 to correctly interpret a one bit.

The first control signal $C_{PU\_N}$ and the second control signal $C_{PU\_P}$ may be calibrated for a first one of the voltage levels of vdda in the lookup table as follows. The voltage circuit 580 may set the voltage of vdda to the first one of the voltage levels, and the control circuit 560 may set the value of the third control signal $C_{PD}$ for the second pull-down circuit 930 to the value of the third control signal $C_{PD}$ determined for the first one of the voltage levels of vdda discussed above.

The control circuit 560 may then calibrate the first control signal $C_{PU\_N}$. In one example, the control circuit 560 may calibrate the first control signal $C_{PU\_N}$ first with the second pull-up circuit 950 turned off or at the lowest drive-strength setting for the second pull-up circuit 950 (e.g., lowest value of the second control signal $C_{PU\_P}$). The control circuit 560 may initialize the first control signal $C_{PU\_N}$ to an initial value that is below a maximum value of the first control signal $C_{PU\_N}$. The control circuit 560 may then sweep the first control signal $C_{PU\_N}$ (e.g., sequentially increment the value of the first control signal $C_{PU\_N}$) while observing the output 962 of the comparator 960. For example, the control circuit 650 may sweep the first control signal $C_{PU\_N}$ in a direction that increases the drive strength of the first pull-up circuit 940. In this example, the output 962 of the comparator 960 toggles (e.g., the logic state at the output 966 toggles) when the voltage at the output node 915 reaches the target voltage corresponding to the output high voltage $V_{OH}$. In this example, if the output 962 of the comparator 960 toggles, then the control circuit 560 may record the value of the first control signal $C_{PU\_N}$ at which the output 962 toggles, and use this value as the calibrated value of the first control signal $C_{PU\_N}$ for the first one of the voltage levels of vdda. For example, the control circuit 560 may store this value in the lookup table in the memory 590 as the value of the first control signal $C_{PU\_N}$ that maps to the first one of the voltage levels of vdda. In this case, the first pull-up circuit 940 may provide enough drive strength to pull up the output node 915 to the output high voltage $V_{OH}$ without assistance from the second pull-up circuit 950. In this regard, the control circuit 560 may indicate that the second pull-up circuit 950 is not needed for the first one of the voltage levels of vdda in the lookup table and/or map the lowest value of the second control signal $C_{PU\_P}$ to the first one of the voltage levels of vdda in the lookup table.

If, on the other hand, the control circuit 560 increases the value of the first control signal $C_{PU\_N}$ to the maximum value of the first control signal $C_{PU\_N}$ without the output 962 of the comparator 960 toggling, then the control circuit 560 may proceed with calibration of the second control signal $C_{PU\_P}$. In this case, the first one of the voltage levels of vdda may be too low for the first pull-up circuit 940 to pull up the output node 915 to the output high voltage $V_{OH}$ without assistance from the second pull-up circuit 950.

During calibration of the second control signal $C_{PU\_P}$, the control circuit 560 may leave the value of the first control signal $C_{PU\_N}$ at the maximum value. The control circuit 560 may initialize the second control signal $C_{PU\_P}$ to an initial value that is below a maximum value for the second control signal $C_{PU\_P}$. The control circuit 560 may then sweep the second control signal $C_{PU\_P}$ (e.g., sequentially increment the value of the second control signal $C_{PU\_P}$) while observing the output 962 of the comparator 960. For example, the control circuit 650 may sweep the second control signal $C_{PU\_P}$ in a direction that increases the drive strength of the second pull-up circuit 950. In this example, the output 962 of the comparator 960 toggles (e.g., the logic state at the output 966 toggles) when the voltage at the output node 915 reaches the target voltage corresponding to the output high voltage $V_{OH}$. In this example, when the output 962 of the comparator 960 toggles, the control circuit 560 may record the value of the second control signal $C_{PU\_P}$ at which the output 962 toggles, and use this value as the calibrated value of the second control signal $C_{PU\_P}$ for the first one of the voltage levels of vdda. For example, the control circuit 560 may store this value in the lookup table in the memory 590 as the value of the second control signal $C_{PU\_P}$ that maps to the first one of the voltage levels of vdda. In this example, the control circuit 560 may also map the maximum value of the first control signal $C_{PU\_N}$ to the first one of the voltage levels of vdda in the lookup table.

The control circuit 560 may perform the exemplary calibration procedure discussed above for each one of the other voltage levels of vdda in the lookup table (e.g., a second one of the voltage levels, a third one of the voltage levels, etc.). For example, the control circuit 560 may perform the above calibration procedure for each of the voltage levels of vdda in the lookup table to populate the values of the first control signal $C_{PU\_N}$ and the values of the second control signal $C_{PU\_P}$ in the lookup table for the different voltage levels of vdda. The control circuit 560 may then use the values of the third control signal $C_{PU\_N}$ and the values of the second control signal $C_{PU\_P}$ in the lookup table to set the value of the first control signal $C_{PU\_N}$ and the values of the second control signal $C_{PU\_P}$ to for the pull-up circuits 540 and 550 in the transmitter 510 based on the current voltage level of vdda, as discussed above.

Figure 10A:
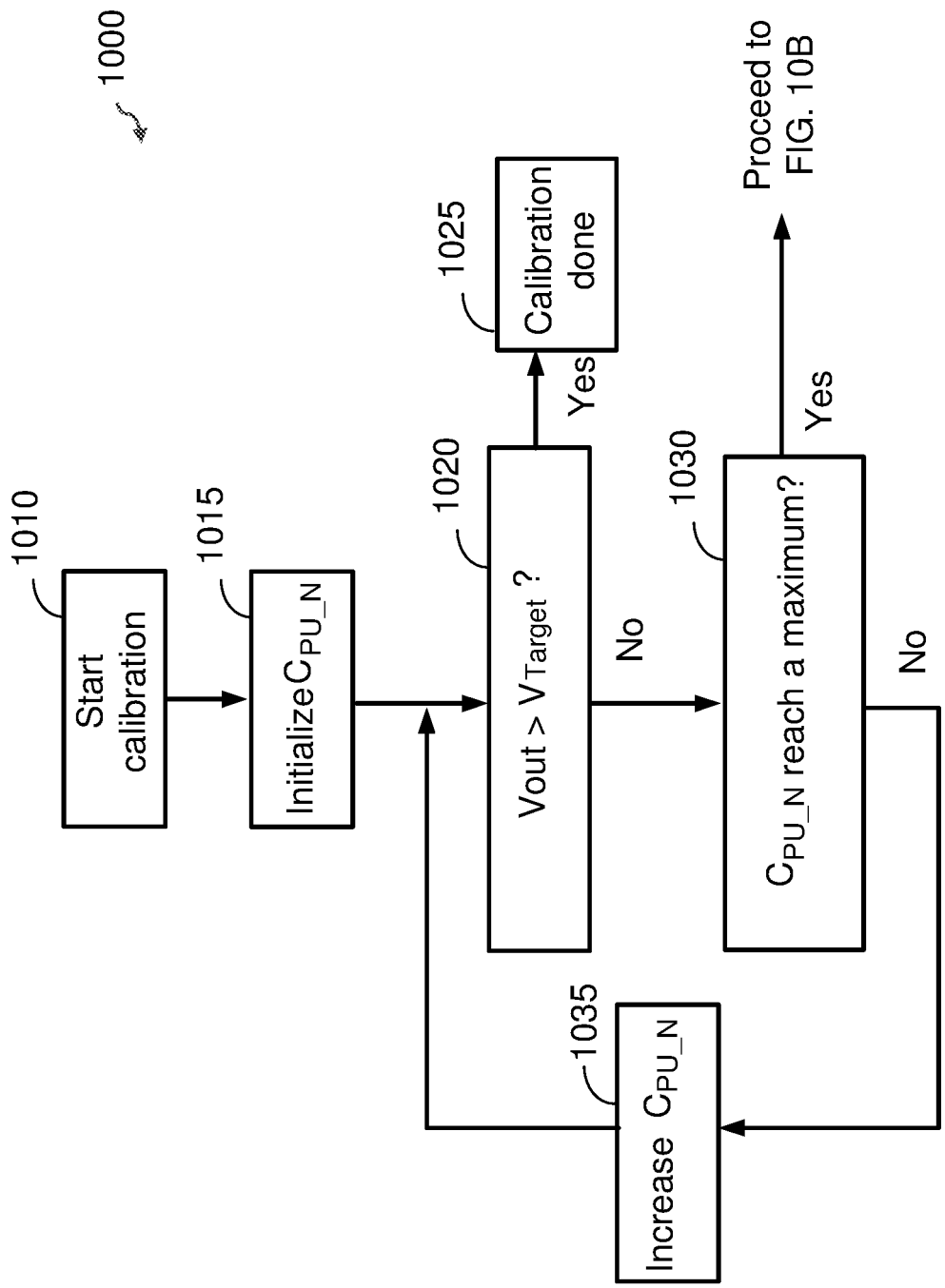
FIG. 10A is a flowchart illustrating a method for calibrating a first pull-up circuit according to certain aspects of the present disclosure.
Figure 10B:
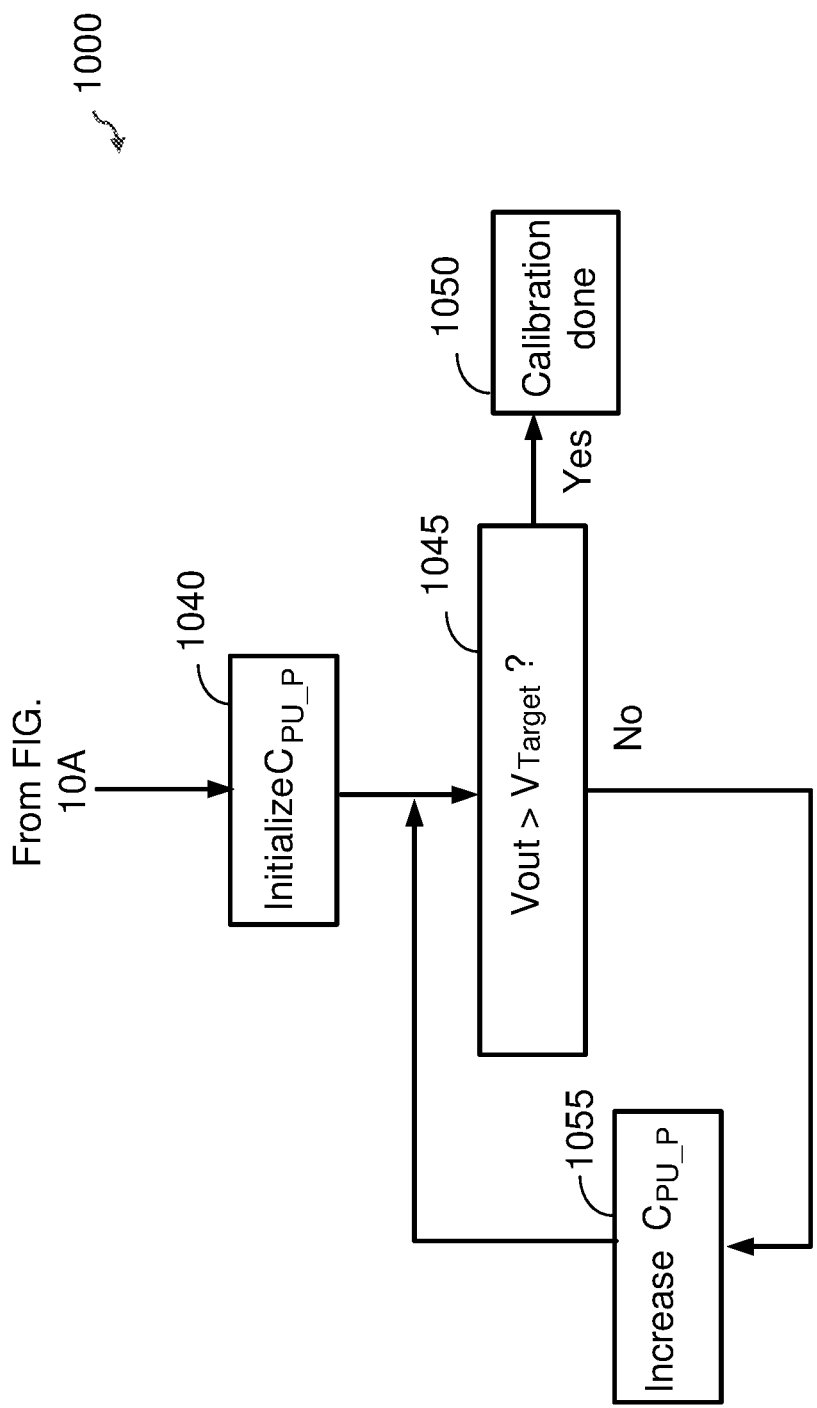
FIG. 10B is a flowchart illustrating a method for calibrating a second pull-up circuit according to certain aspects of the present disclosure.

FIGS. 10A and 10B illustrate a calibration method 1000 according to certain aspects. The method 1000 may be performed by the calibration circuit 905 and the control circuit 560 according to certain aspects. The method 1000 may be performed for each of the voltage levels of vdda in the lookup table. It is to be understood that the specific order or hierarchy of blocks in the method 1000 illustrated in FIGS. 10A and 10B is an example. Accordingly, it is to be appreciated that the method 1000 is not limited to the specific order or hierarchy illustrated in the example in FIGS. 10A and 10B unless specifically recited therein.

FIG. 10A illustrates calibration of the first control signal $C_{PU\_N}$ and FIG. 10B illustrates calibration of the second control signal $C_{PU\_P}$. In certain aspects, the method 1000 calibrates the first control signal $C_{PU\_N}$ in FIG. 10A. The method 1000 proceeds to calibrate the second control signal $C_{PU\_P}$ in FIG. 10B if the first control signal $C_{PU\_N}$ saturates (i.e., reaches a maximum value for the first control signal $C_{PU\_N}$). Thus, in these aspects, the method 1000 may or may not proceed with calibration of the second control signal $C_{PU\_P}$ in FIG. 10B depending on whether the first control signal $C_{PU\_N}$ saturates in FIG. 10A.

Referring to FIGS. 10A, calibration for a voltage level of the vdda begins at block 1010. In one example, the voltage circuit 580 may set the voltage level of vdda to the voltage level for which calibration is being performed. The control circuit 560 may also set the value of the third control signal $C_{PD}$ for the second pull-down circuit 930 to the value of the third control signal $C_{PD}$ that was previously determined during the calibration of the third control signal $C_{PD}$ discussed above.

At block 1015, the control circuit 560 may initialize the first control signal $C_{PU\_N}$ to an initial value that is below a maximum value for the first control signal $C_{PU\_N}$. For example, the initial value may correspond to the lowest value of the first control signal $C_{PU\_N}$. However, it is to be appreciated that the initial value is not limited to this example.

At block 1020, the control circuit 560 may determine whether the output voltage at the output node 915 (labeled "Vout" in FIG. 10A) is above the target voltage (e.g., based on the output 966 of the comparator 960). For example, the control circuit 560 may determine that the output voltage is above the target voltage when the output 966 of the comparator 960 toggles (i.e., the output 966 changes logic states). The target voltage may correspond to the output high voltage $V_{OH}$ in the specification discussed above. The output high voltage $V_{OH}$ may be equal to vddio/2 or another voltage.

If the output voltage is above the target voltage at block 1020, then the calibration may be done at block 1025, and the control circuit 560 may use the current value of the first control signal $C_{PU\_N}$ as the calibrated value of the first control signal $C_{PU\_N}$ for the current voltage level of vdda (i.e., the voltage level of vdda at which the calibration is performed). The method 1000 may then be repeated for a next one of the voltage levels of vdda.

If the output voltage is not above the target voltage at block 1020, then the control circuit 560 may determine whether the value of the first control signal $C_{PU\_N}$ has reached the maximum value for the first control signal $C_{PU\_N}$. The maximum value may correspond to a value that causes all of the segments 630-1 to 630-n in the example in FIG. 6 to be enabled. However, it is to be appreciated that the present disclosure is not limited to this example. If the maximum value is reached, then the method 1000 may proceed to calibration of the second control signal $C_{PU\_P}$ in FIG. 10B. If the maximum value is not reached, then the method 1000 may proceed to block 1035.

At block 1035, the control circuit 560 increases the value of the first control signal $C_{PU\_N}$. For example, the control circuit 560 may increment the value of the first control signal $C_{PU\_N}$. Increasing the value of the first control signal $C_{PU\_N}$ increases the drive strength of the first pull-up circuit 940, which causes the output voltage to increase.

After block 1035, the method 1000 returns to block 1020 in which the control circuit 560 determines whether the output voltage is greater than the target voltage. The loop including blocks 1020, 1030, and 1035 may be repeated until the output voltage is greater than the target voltage or the first control signal $C_{PU\_N}$ reaches the maximum value with the output voltage still below the target voltage. For the case where the first control signal $C_{PU\_N}$ reaches the maximum value with the output voltage still below the target voltage, the method 1000 proceeds to calibration of the second control signal $C_{PU\_P}$ in FIG. 10B. In this case, the current voltage level of vdda may be too low for the first pull-up circuit 940 to pull up the output node 915 to the target voltage without assistance from the second pull-up circuit 950. During calibration of the second control signal $C_{PU\_P}$, the control circuit 560 may leave the value of the first control signal $C_{PU\_N}$ at the maximum value.

Referring to FIG. 10B, at block 1040, the control circuit 560 may initialize the second control signal $C_{PU\_P}$ (e.g., to a lowest value of the second the second control signal $C_{PU\_P}$ or another value).

At block 1045, the control circuit 560 may determine whether the output voltage at the output node 915 (labeled "Vout" in FIG. 10B) is above the target voltage (e.g., based on the output 966 of the comparator 960). For example, the control circuit 560 may determine that the output voltage is above the target voltage when the output 966 of the comparator 960 toggles (i.e., the output 966 changes logic states).

If the output voltage is above the target voltage at block 1045, then the calibration may be done at block 1050, and the control circuit 560 may use the current value of the second control signal $C_{PU\_P}$ as the calibrated value of the second control signal $C_{PU\_N}$ for the current voltage level of vdda (i.e., the voltage level of vdda at which the calibration is performed). The control circuit 560 may also use the maximum value of the first control signal $C_{PU\_N}$ as the calibrated value of the first control signal $C_{PU\_P}$ for the current voltage level of vdda. The method 1000 may then be repeated for a next one of the voltage levels of vdda.

If the output voltage is not above the target voltage at block 1045, then the control circuit 560 increases the value of the second control signal $C_{PU\_P}$ at block 1055. For example, the control circuit 560 may increment the value of the second control signal $C_{PU\_P}$. Increasing the value of the second control signal $C_{PU\_P}$ increases the drive strength of the second pull-up circuit 950, which causes the output voltage to increase.

After block 1055, the method 1000 returns to block 1045 in which the control circuit 560 determines whether the output voltage is greater than the target voltage. The loop including block 1045 and block 1055 may be repeated until the output voltage is greater than the target voltage.

If the maximum value of the second control signal $C_{PU\_P}$ is reached without the output voltage being greater than the target voltage, then the control circuit 560 may determine that the target voltage (e.g., the output high voltage $V_{OH}$) can not be met at the current voltage level of vdda. In this case, the frequency band assigned to the current voltage level of vdda may be reassigned to a next higher one of the voltage levels supported by the voltage circuit 580 for which the target voltage can be met.

Figure 11:
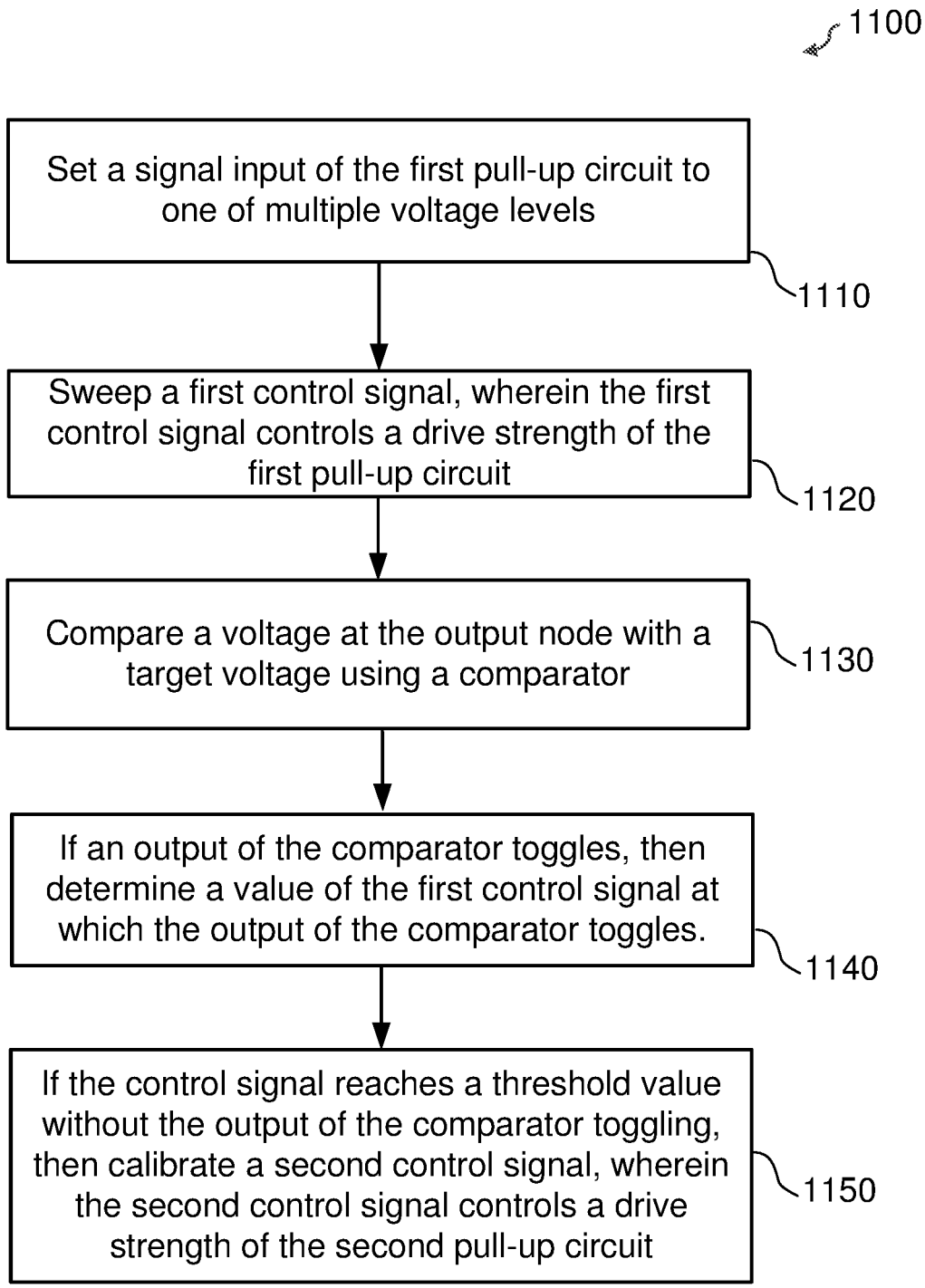
FIG. 11 is a flowchart illustrating a method of calibration according to certain aspects of the present disclosure.

FIG. 11 illustrates a method 1100 of calibration according to certain aspects. The method 1100 uses a calibration circuit (e.g., calibration circuit 905) including a first pull-up circuit (e.g., first pull-up circuit 940) and a second pull-up circuit (e.g., second pull-up circuit 950), wherein each one of the first pull-up circuit and the second pull-up circuit is configured to pull up an output node (e.g., output node 915).

At block 1110, a signal input of the first pull-up circuit is set to one of multiple voltage levels. For example, the signal input may correspond to signal input 942. The one of the multiple voltage levels may be one of the voltage levels of vdda discussed above. In certain aspects, the voltage level may be set by the voltage circuit 580. The multiple voltage levels may correspond to different frequencies and/or different frequency bands.

At block 1120, a first control signal is sweep, wherein the first control signal controls a drive strength of the first pull-up circuit. The first control signal may correspond to the first control signal $C_{PU\_N}$. In certain aspects, the control circuit 560 may sweep the first control signal in a direction that increases the drive strength of the first pull-up circuit. In certain aspects, the first control signal includes a first digital code, and sweeping the first control signal includes sequentially changing the first digital code (e.g., incrementing a value of the first digital code).

At block 1130, a voltage at the output node is compared with a target voltage using a comparator. For example, the comparator may correspond to the comparator 960. In certain aspects, the target voltage corresponds to an output high voltage $V_{OH}$ defined by a standard (e.g., JEDEC standard). In certain aspects, the first pull-up circuit is coupled between a supply rail and the output node, and the target voltage is approximately equal to half a supply voltage (e.g., vddio) of the supply rail.

At block 1140, if an output of the comparator toggles, then a value of the first control signal at which the output of the comparator toggles is determined. For example, the control circuit 560 may determine the value of the first control signal at which the output of the comparator toggles (e.g., changes or switches logic states). In certain aspects, the control circuit 560 may store the value of the first control signal in a lookup table that maps the value of the first control signal to the one of the multiple voltage levels (e.g., one of the voltage levels of vdda). In certain aspects, the first control signal may include a digital code including multiple bits in which the value of the first control signal corresponds to a respective combination of bits values of the multiple bits.

At block 1150, if the first control signal reaches a threshold value without the output of the comparator toggling, then a second control signal may be calibrated, wherein the second control signal controls a drive strength of the second pull-up circuit. The calibration may be performed by the control circuit 560, the second pull-up circuit 950, and the comparator 960. In certain aspects, the threshold value provides a condition in which calibration of the second control signal is performed. The threshold value may be a maximum value of the first control signal (i.e., the value of the first control signal corresponding to s maximum drive strength of the first pull-up circuit 940 for the current voltage level of vdda), but is not limited to this example. The second control signal may correspond to the second control signal $C_{PU\_P}$.

In certain aspects, the exemplary method 1100 may be performed for each one of the other ones of the multiple voltage levels (e.g., voltage levels for vdda).

In certain aspects, calibrating the second control signal may include sweeping the second control signal, comparing the voltage at the output node with the target voltage using the comparator, and determining a value of the second control signal at which the output of the comparator toggles. For example, the second control signal may include a second digital code and sweeping the second control signal may include sequentially changing the second digital code (e.g., incrementing a value of the second digital code). The sweeping of the second control signal may be in a direction that increases the drive strength of the second pull-up circuit. In certain aspects, the control circuit 560 may store the value of the second control signal in a lookup table that maps the value of the second control signal to the one of the multiple voltage levels (e.g., one of the voltage levels of vdda). In certain aspects, the second control signal may include a digital code including multiple bits in which the value of the second control signal corresponds to a respective combination of bits values of the multiple bits.

In certain aspects, a signal input (e.g., signal input 952) of the second pull-up circuit is set to a voltage level (e.g., vss) that is lower than each one of the multiple voltage levels.

In certain aspects, the first pull-up circuit includes n-type field effect transistors (NFETs) (e.g., NFETs 640-1 to 640-n) for pulling up the output node, and the first control signal controls the drive strength of the first pull-up circuit by controlling which ones of the NFETs are enabled. In certain aspects, the second pull-up circuit includes p-type field effect transistors (PFETs) (e.g., 660-1 to 660-m) for pulling up the output node, and the second control signal controls the drive strength of the second pull-up circuit by controlling which ones of the PFETs are enabled.

In certain aspects, the calibration circuit further includes a pull-down circuit (e.g., first pull-down circuit 920) and a resistor (e.g., resistor 918) coupled in series between a first rail (e.g., supply rail for vddio) and second rail (e.g., low rail). In these aspects, the method 1100 may further include sweeping a third control signal (e.g., third control signal $C_{PD}$), wherein the third control signal controls a drive strength of the pull-down circuit, comparing a voltage at the node between the pull-down circuit and resistor with the target voltage using the comparator, and determining a value of the third control signal at which the output of the comparator toggles.

The control circuit 560 may be implemented with a general-purpose processor, a digital signal processor (DSP), an application specific integrated circuit (ASIC), a field programmable gate array (FPGA) or other programmable logic device, a finite state machine, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

It is to be appreciated that a transistor may be physically implemented on a chip (e.g., the first chip 110) with multiple transistors coupled in parallel and/or series in which the gates of the multiple transistors are coupled together. In these implementations, the width (e.g., channel or gate width) of a transistor may be approximately to the sum of the widths of the transistors on the chip that are coupled in parallel to form the transistor.

Implementation examples are described in the following numbered clauses:

1. A system, comprising:
   a transmitter, wherein the transmitter comprises:
      a pull-down circuit coupled between an output of the transmitter and a first rail, wherein the pull-down circuit has a signal input coupled to a first input of the transmitter;
      a first pull-up circuit coupled between a second rail and the output of the transmitter, wherein the first pull-up circuit has a signal input coupled to a second input of the transmitter;
      a second pull-up circuit coupled between the second rail and the output of the transmitter, wherein the second pull-up circuit has a signal input coupled to the first input of the transmitter; and
      a control circuit coupled to a control input of the first pull-up circuit and a control input of the second pull-up circuit, wherein the control circuit is configured to:
         output a first control signal to the control input of the first pull-up circuit, wherein the first control signal controls a drive strength of the first pull-up circuit, and
         output a second control signal to the control input of the second pull-up circuit, wherein the second control signal controls a drive strength of the second pull-up circuit.
2. The system of clause 1, wherein the second rail is at a higher potential than the first rail.
3. The system of clause 1 or 2, wherein the first pull-up circuit comprises:
   n-type field effect transistors (NFETs), wherein a gate of each one of the NFETs is coupled to the second input of the transmitter; and
   first switches, wherein each one of the first switches is coupled in series with a respective one of the NFETs between the second rail and the output of the transmitter, and on/off states of the first switches are controlled by the first control signal.
4. The system of clause 3, wherein the second pull-up circuit comprises:
   p-type field effect transistors (PFETs), wherein a gate of each one of the PFETs is coupled to the first input of the transmitter; and
   second switches, wherein each one of the second switches is coupled in series with a respective one of the PFETs between the second rail and the output of the transmitter, and on/off states of the second switches are controlled by the second control signal.
5. The system of clause 4, wherein:
   the first control signal comprises a first digital code; and
   the second control signal comprises a second digital code.
6. The system of any one of clauses 1 to 5, further comprising a pre-drive circuit having a first output coupled to the first input of the transmitter, and a second output coupled to the second input of the transmitter, wherein the pre-drive circuit is configured to:
   output a pre-drive signal at the first output of the pre-drive circuit; and
   output a complement of the pre-drive signal at the second output of the pre-drive circuit.
7. The system of clause 6, wherein the pre-drive circuit is coupled to a third rail having a first supply voltage, and the second rail has a second supply voltage.
8. The system of clause 7, further comprising a voltage circuit configured to scale the first supply voltage based on a frequency of the pre-drive signal.
9. The system of clause 8, wherein the control circuit is configured to:
   set the first control signal to a first value and set the second control signal to a second value when the first supply voltage is at a first voltage level; and
   set the first control signal to a third value and set the second control signal to a fourth value when the first supply voltage is at a second voltage level.
10. The system of any one of clauses 6 to 9, wherein:
    the first pull-up circuit is configured to pull up the output of the transmitter when the complement of the pre-drive signal is high; and
    the second pull-up circuit is configured to pull up the output of the transmitter when the pre-drive signal is low.
11. The system of clause 10, wherein the pull-down circuit is configured to pull down the output of the transmitter when the pre-drive signal is high.
12. A method of calibration using a calibration circuit including a first pull-up circuit and a second pull-up circuit, wherein each one of the first pull-up circuit and the second pull-up circuit is configured to pull up an output node, the method comprising:
    setting a signal input of the first pull-up circuit to one of multiple voltage levels;
    sweeping a first control signal, wherein the first control signal controls a drive strength of the first pull-up circuit;

comparing a voltage at the output node with a target voltage using a comparator;
if an output of the comparator toggles, then determining a value of the first control signal at which the output of the comparator toggles; and
if the first control signal reaches a threshold value without the output of the comparator toggling, then calibrating a second control signal, wherein the second control signal controls a drive strength of the second pull-up circuit.

13. The method of clause 12, wherein the target voltage corresponds to an output high voltage defined by a standard.

14. The method of clause 12 or 13, wherein the threshold value is a maximum value of the first control signal.

15. The method of any one of clauses 12 to 14, wherein the first pull-up circuit is coupled between a supply rail and the output node, and the target voltage is approximately equal to half a supply voltage of the supply rail.

16. The method of any one of clauses 12 to 15, wherein sweeping the first control signal comprises sweeping the first control signal in a direction of increasing the drive strength of the first pull-up circuit.

17. The method of any one of clauses 12 to 16, wherein calibrating the second control signal comprises:
sweeping the second control signal;
comparing the voltage at the output node with the target voltage using the comparator; and
determining a value of the second control signal at which the output of the comparator toggles.

18. The method of clause 17, wherein the first control signal comprises a first digital code, and the second control signal comprises a second digital code.

19. The method of clause 18, wherein:
sweeping the first control signal comprises sequentially changing the first digital code, and
sweeping the second control signal comprises sequentially changing the second digital code.

20. The method of any one of clauses 17 to 19, wherein a signal input of the second pull-up circuit is set to a voltage level that is lower than each one of the multiple voltage levels.

21. The method of any one of clauses 17 to 20, wherein the signal input of the second pull-up circuit is coupled to a ground.

22. The method of any one of clauses 17 to 21, wherein:
the first pull-up circuit comprises n-type field effect transistors (NFETs) for pulling up the output node; and
the first control signal controls the drive strength of the first pull-up circuit by controlling which ones of the NFETs are enabled.

23. The method of clause 22, wherein:
the second pull-up circuit comprises p-type field effect transistors (PFETs) for pulling up the output node; and
the second control signal controls the drive strength of the second pull-up circuit by controlling which ones of the PFETs are enabled.

24. The method of any one of clauses 12 to 23, wherein the calibration circuit further includes a pull-down circuit and a resistor coupled in series between a first rail and a second rail, and the method further comprises:
sweeping a third control signal, wherein the third control signal controls a drive strength of the pull-down circuit;
comparing a voltage at the node between the pull-down circuit and resistor with the target voltage using comparator; and
determining a value of the third control signal at which the output of the comparator toggles.

25. The method of clause 24, wherein the target voltage is approximately equal to half a supply voltage of the first rail.

26. The method of clause 25, wherein the second rail is coupled to a ground.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 10 percent of the stated value. For example, approximately equal to vddio/2 means within a range between 90 percent of vddio/2 and 110 percent of vddio/2.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a transmitter, wherein the transmitter comprises:
a pull-down circuit coupled between an output of the transmitter and a first rail, wherein the pull-down circuit has a signal input coupled to a first input of the transmitter;
a first pull-up circuit coupled between a second rail and the output of the transmitter, wherein the first pull-up circuit has a signal input coupled to a second input of the transmitter;
a second pull-up circuit coupled between the second rail and the output of the transmitter, wherein the second pull-up circuit has a signal input coupled to the first input of the transmitter; and
a control circuit coupled to a control input of the first pull-up circuit and a control input of the second pull-up circuit, wherein the control circuit is configured to:
output a first control signal to the control input of the first pull-up circuit, wherein the first control signal controls a drive strength of the first pull-up circuit, and output a second control signal to the control input of the second pull-up circuit, wherein the second control signal controls a drive strength of the second pull-up circuit.

2. The system of claim 1, wherein the second rail is at a higher potential than the first rail.

3. The system of claim 1, wherein the first pull-up circuit comprises:
n-type field effect transistors (NFETs), wherein a gate of each one of the NFETs is coupled to the second input of the transmitter; and
first switches, wherein each one of the first switches is coupled in series with a respective one of the NFETs between the second rail and the output of the transmitter, and on/off states of the first switches are controlled by the first control signal.

4. The system of claim 3, wherein the second pull-up circuit comprises:
p-type field effect transistors (PFETs), wherein a gate of each one of the PFETs is coupled to the first input of the transmitter; and
second switches, wherein each one of the second switches is coupled in series with a respective one of the PFETs between the second rail and the output of the transmitter, and on/off states of the second switches are controlled by the second control signal.

5. The system of claim 4, wherein:
the first control signal comprises a first digital code; and
the second control signal comprises a second digital code.

6. The system of claim 1, further comprising a pre-drive circuit having a first output coupled to the first input of the transmitter, and a second output coupled to the second input of the transmitter, wherein the pre-drive circuit is configured to:
output a pre-drive signal at the first output of the pre-drive circuit; and
output a complement of the pre-drive signal at the second output of the pre-drive circuit.

7. The system of claim 6, wherein the pre-drive circuit is coupled to a third rail having a first supply voltage, and the second rail has a second supply voltage.

8. The system of claim 7, further comprising a voltage circuit configured to scale the first supply voltage based on a frequency of the pre-drive signal.

9. The system of claim 8, wherein the control circuit is configured to:
set the first control signal to a first value and set the second control signal to a second value when the first supply voltage is at a first voltage level; and
set the first control signal to a third value and set the second control signal to a fourth value when the first supply voltage is at a second voltage level.

10. The system of claim 6, wherein:
the first pull-up circuit is configured to pull up the output of the transmitter when the complement of the pre-drive signal is high; and
the second pull-up circuit is configured to pull up the output of the transmitter when the pre-drive signal is low.

11. The system of claim 10, wherein the pull-down circuit is configured to pull down the output of the transmitter when the pre-drive signal is high.

12. A method of calibration using a calibration circuit including a first pull-up circuit and a second pull-up circuit, wherein each one of the first pull-up circuit and the second pull-up circuit is configured to pull up an output node, the method comprising:

setting a signal input of the first pull-up circuit to one of multiple voltage levels;
sweeping a first control signal, wherein the first control signal controls a drive strength of the first pull-up circuit;
comparing a voltage at the output node with a target voltage using a comparator;
if an output of the comparator toggles, then determining a value of the first control signal at which the output of the comparator toggles; and
if the first control signal reaches a threshold value without the output of the comparator toggling, then calibrating a second control signal, wherein the second control signal controls a drive strength of the second pull-up circuit.

13. The method of claim 12, wherein the target voltage corresponds to an output high voltage defined by a standard.

14. The method of claim 12, wherein the threshold value is a maximum value of the first control signal.

15. The method of claim 12, wherein the first pull-up circuit is coupled between a supply rail and the output node, and the target voltage is approximately equal to half a supply voltage of the supply rail.

16. The method of claim 12, wherein sweeping the first control signal comprises sweeping the first control signal in a direction of increasing the drive strength of the first pull-up circuit.

17. The method of claim 12, wherein calibrating the second control signal comprises:
sweeping the second control signal;
comparing the voltage at the output node with the target voltage using the comparator; and
determining a value of the second control signal at which the output of the comparator toggles.

18. The method of claim 17, wherein the first control signal comprises a first digital code, and the second control signal comprises a second digital code.

19. The method of claim 18, wherein:
sweeping the first control signal comprises sequentially changing the first digital code, and
sweeping the second control signal comprises sequentially changing the second digital code.

20. The method of claim 17, wherein a signal input of the second pull-up circuit is set to a voltage level that is lower than each one of the multiple voltage levels.

21. The method of claim 17, wherein the signal input of the second pull-up circuit is coupled to a ground.

22. The method of claim 17, wherein:
the first pull-up circuit comprises n-type field effect transistors (NFETs) for pulling up the output node; and
the first control signal controls the drive strength of the first pull-up circuit by controlling which ones of the NFETs are enabled.

23. The method of claim 22, wherein:
the second pull-up circuit comprises p-type field effect transistors (PFETs) for pulling up the output node; and
the second control signal controls the drive strength of the second pull-up circuit by controlling which ones of the PFETs are enabled.

24. The method of claim 12, wherein the calibration circuit further includes a pull-down circuit and a resistor coupled in series between a first rail and a second rail, and the method further comprises:
sweeping a third control signal, wherein the third control signal controls a drive strength of the pull-down circuit;

comparing a voltage at the node between the pull-down circuit and resistor with the target voltage using comparator; and determining a value of the third control signal at which the output of the comparator toggles.

25. The method of claim 24, wherein the target voltage is approximately equal to half a supply voltage of the first rail.

26. The method of claim 25, wherein the second rail is coupled to a ground.

* * * * *